(12) United States Patent
Yuzawa et al.

(10) Patent No.: US 10,060,818 B2
(45) Date of Patent: Aug. 28, 2018

(54) PRESSURE SENSOR AND ELECTRONIC DEVICE COMPRISING A PRESSURE SENSOR

(71) Applicant: KABUSHIKI KAISHA TOSHIBA, Tokyo (JP)

(72) Inventors: Akiko Yuzawa, Kanagawa (JP); Yasushi Tomizawa, Tokyo (JP); Yoshihiko Fuji, Kanagawa (JP); Michiko Hara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/440,876

(22) Filed: Feb. 23, 2017

(65) Prior Publication Data
US 2018/0058965 A1    Mar. 1, 2018

(30) Foreign Application Priority Data
Aug. 24, 2016    (JP) .................... 2016-164084

(51) Int. Cl.
*G01L 9/16* (2006.01)
*G01L 9/00* (2006.01)
(Continued)

(52) U.S. Cl.
CPC ............ *G01L 9/16* (2013.01); *G01L 9/008* (2013.01); *H01L 41/0805* (2013.01);
(Continued)

(58) Field of Classification Search
CPC ....... G01L 9/06; G01L 1/2206; G01L 1/2287; G01L 7/08
See application file for complete search history.

(56) References Cited

U.S. PATENT DOCUMENTS 7,490,522 B2 *  2/2009  Ruehrig ................ G01L 1/12
                                             73/862.335
8,958,574 B2 *  2/2015  Fukuzawa ........... G01L 9/0042
                                             381/115
(Continued)

FOREIGN PATENT DOCUMENTS

JP    2007-218760    8/2007
JP    2010-232971    10/2010
(Continued)

OTHER PUBLICATIONS

P. Alpuim et al., "Fabrication of a strain sensor for bone implant failure detection based on piezoresistive doped nanocrystalline silicon" *Journal of Non-Crystalline Solids* 354 (2008) 2585-2589.

*Primary Examiner* — Harshad R Patel
*Assistant Examiner* — Jamel Williams
(74) *Attorney, Agent, or Firm* — Finnegan, Henderson, Farabow, Garrett & Dunner, L.L.P.

(57) ABSTRACT

A sensor includes a first film, a first sensor portion, and a first element portion. The first film is deformable. The first sensor portion is provided at the first film. The first sensor portion includes a first magnetic layer, a second magnetic layer provided between the first film and the first magnetic layer, and a first intermediate layer provided between the first magnetic layer and the second magnetic layer. The first element portion includes a first piezoelectric layer fixed to the first film.

20 Claims, 27 Drawing Sheets

(51) Int. Cl.
*H01L 41/08* (2006.01)
*H01L 41/113* (2006.01)
*H01L 41/18* (2006.01)
*H01L 43/02* (2006.01)

(52) U.S. Cl.
CPC .......... *H01L 41/1132* (2013.01); *H01L 41/18* (2013.01); *H01L 43/02* (2013.01)

(56) References Cited

U.S. PATENT DOCUMENTS

| | | | |
|---|---|---|---|
| 8,973,446 B2* | 3/2015 | Fukuzawa | G01L 1/12 |
| | | | 73/779 |
| 9,197,967 B2 | 11/2015 | Mortensen | |
| 9,651,432 B2* | 5/2017 | Fuji | G01L 9/007 |
| 2011/0204750 A1* | 8/2011 | Fujii | H01L 41/094 |
| | | | 310/330 |
| 2012/0206014 A1* | 8/2012 | Bibl | B06B 1/0644 |
| | | | 310/331 |
| 2012/0245477 A1 | 9/2012 | Giddings et al. | |
| 2013/0255393 A1* | 10/2013 | Fukuzawa | G01L 1/12 |
| | | | 73/779 |
| 2014/0037121 A1 | 2/2014 | Mortensen | |
| 2014/0369530 A1 | 12/2014 | Fuji et al. | |
| 2015/0268116 A1* | 9/2015 | Fuji | H01L 43/12 |
| | | | 438/3 |
| 2016/0320899 A1* | 11/2016 | Watazu | G06F 3/047 |

FOREIGN PATENT DOCUMENTS

| | | | | |
|---|---|---|---|---|
| JP | 2012-204479 | | 10/2012 | |
| JP | 2013-214753 | | 10/2013 | |
| JP | 2014-240824 | | 12/2014 | |
| JP | 2015137869 A | * | 7/2015 | ........... G01L 1/2287 |
| WO | WO 2006002988 A1 | * | 1/2006 | ............... G01L 1/12 |

* cited by examiner

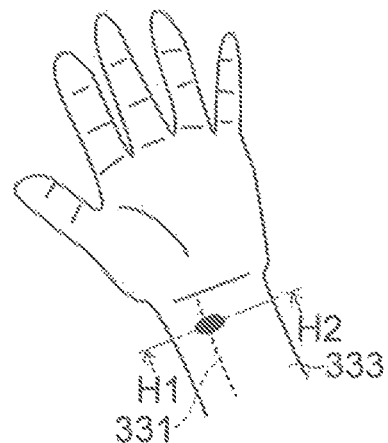
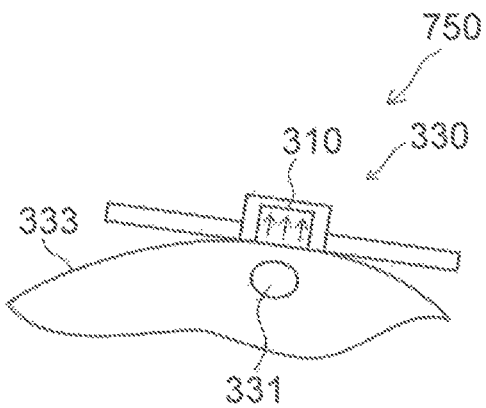
FIG. 34A    FIG. 34B
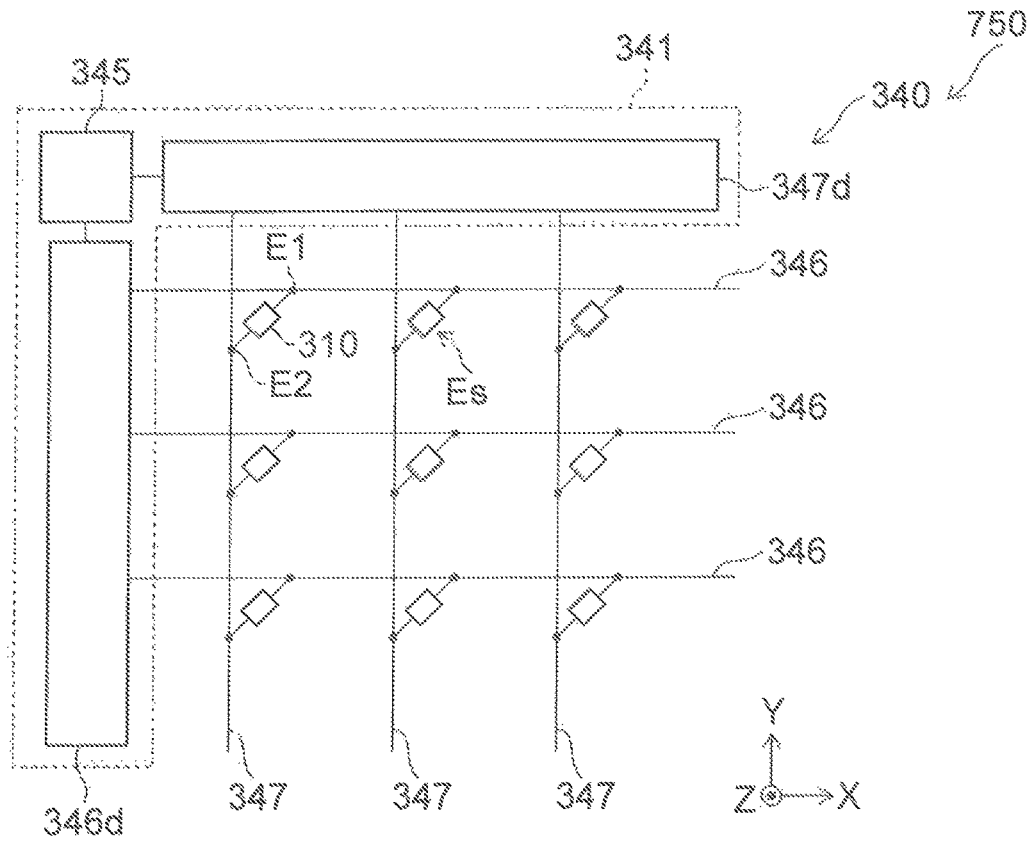
FIG. 35

PRESSURE SENSOR AND ELECTRONIC DEVICE COMPRISING A PRESSURE SENSOR

CROSS REFERENCE TO RELATED APPLICATION

This application is based upon and claims the benefit of priority from Japanese Patent Application No. 2016-164084, filed on Aug. 24, 2016; the entire contents of which are incorporated herein by reference.

FIELD

Embodiments described herein relate generally to a sensor and an electronic device.

BACKGROUND

There is a sensor such as a pressure sensor or the like that converts pressure applied from the outside into an electrical signal. It is desirable to increase the sensing precision of the sensor.

BRIEF DESCRIPTION OF THE DRAWINGS

FIG. 1A to FIG. 1D are schematic views illustrating a sensor according to a first embodiment;

FIG. 34A and FIG. 34B are schematic views illustrating another electronic device according to the fifth embodiment; and FIG. 35 is a schematic view illustrating another electronic device according to the fifth embodiment.

DETAILED DESCRIPTION

Figure 2:
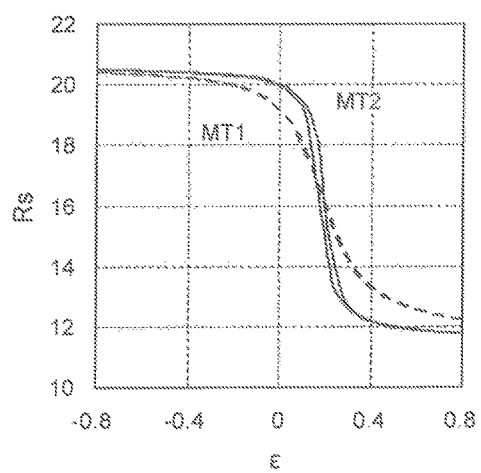
FIG. 2 is a graph illustrating the characteristics of the sensor according to the first embodiment.

According to one embodiment, a sensor includes a first film, a first sensor portion, and a first element portion. The first film is deformable. The first sensor portion is provided at the first film. The first sensor portion includes a first magnetic layer, a second magnetic layer provided between the first film and the first magnetic layer, and a first intermediate layer provided between the first magnetic layer and the second magnetic layer. The first element portion includes a first piezoelectric layer fixed to the first film.

According to another embodiment, a sensor includes a first film, a first opposing film, a first sensor portion, a first film electrode, and a first opposing film. The first film is deformable. The first sensor portion is provided at the first film. The first sensor portion includes a first magnetic layer, a second magnetic layer provided between the first film and the first magnetic layer, and a first intermediate layer provided between the first magnetic layer and the second magnetic layer. The first film electrode is connected to the first film. The first opposing film electrode is connected to the first opposing film. The first opposing film includes a portion separated from the first film in a first direction. The first direction connects the first film and the first sensor portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figures 1A, 1B, 1C, 1D:
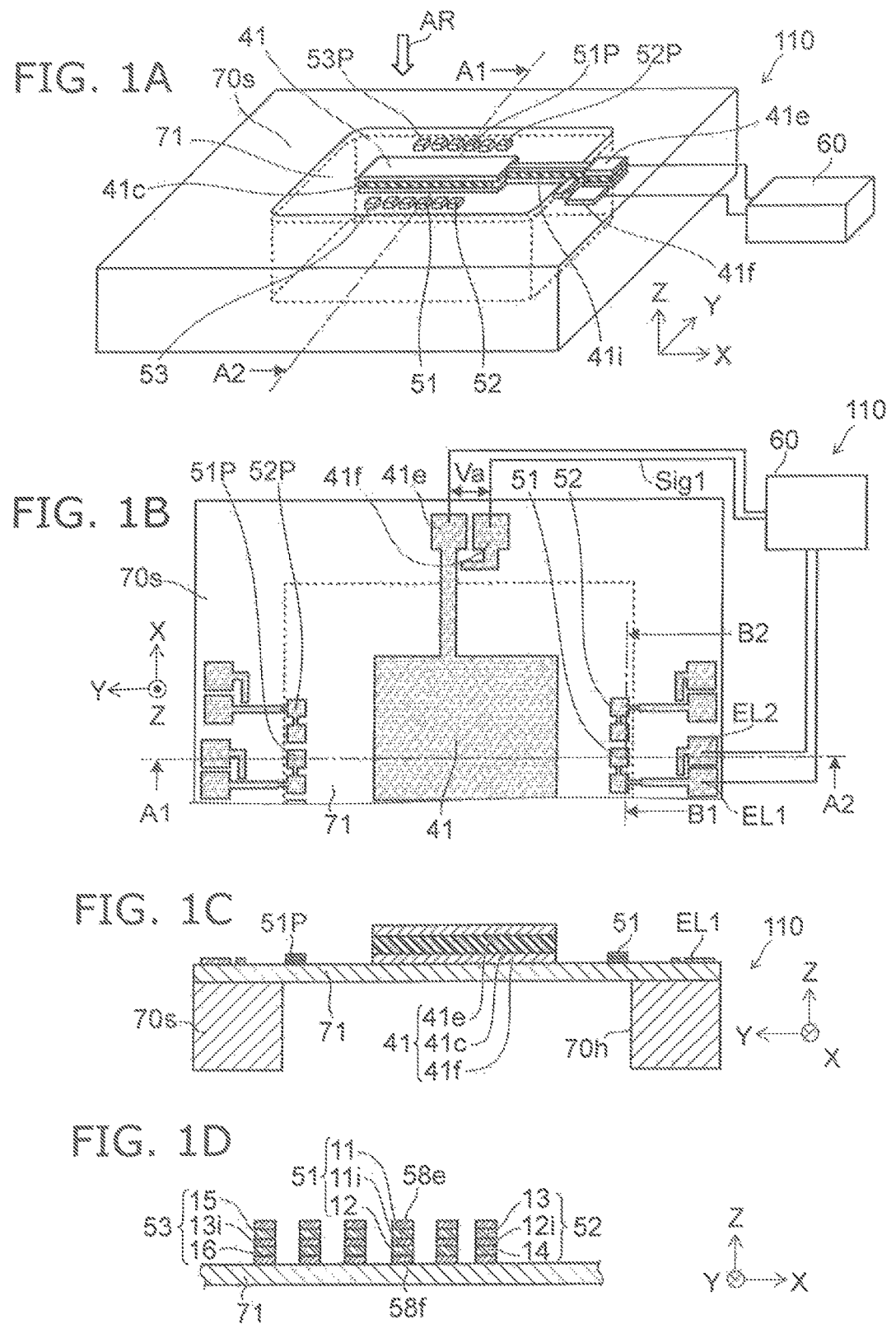

FIG. 1A to FIG. 1D are schematic views illustrating a sensor according to a first embodiment.

FIG. 1A is a perspective view. FIG. 1B is a plan view showing a portion of the sensor when viewed along arrow AR of FIG. 1A. FIG. 1C is a line A1-A2 cross-sectional view of FIG. 1A and FIG. 1B. FIG. 1D is a line B1-B2 cross-sectional view of FIG. 1B.

As shown in FIG. 1A and FIG. 1B, the sensor 110 according to the embodiment includes a first film 71, a first sensor portion 51, and a first element portion 41. The sensor 110 is, for example, a pressure sensor.

The first film 71 is deformable. For example, the first film 71 is supported by a support portion 70s. For example, a recess 70h is formed in a portion of the substrate used to form the first film 71 and the support portion 70s. The thin portion of the substrate is used to form the first film 71. The thick portion of the substrate is used to form the support portion 70s. In the example, the support portion 70s is connected to the outer edge of the first film 71. The planar configuration of the first film 71 is, for example, substantially a quadrilateral (including a rectangle, etc.), a circle (including a flattened circle), etc. As described below, the deformable film recited above may have a free end.

The first film 71 includes, for example, silicon.

The first sensor portion 51 is provided at the first film 71. For example, the first sensor portion 51 is provided on a surface of a portion of the first film 71. The front and back (the top and bottom) of the surface are arbitrary.

As shown in FIG. 1D, the first sensor portion 51 includes a first magnetic layer 11, a second magnetic layer 12, and a first intermediate layer 11*l*. The second magnetic layer 12 is provided between the first film 71 and the first magnetic layer 11. The first intermediate layer 11*i* is provided between the first magnetic layer 11 and the second magnetic layer 12.

A direction (a first direction) that connects the first film 71 and the first sensor portion 51 is taken as a Z-axis direction. For example, the first sensor portion 51 is provided at a portion of the first film 71. In such a case, the direction of the shortest line connecting the first sensor portion 51 and the portion of the first film 71 corresponds to the first direction.

One axis perpendicular to the Z-axis direction is taken as an X-axis direction. A direction perpendicular to the Z-axis direction and the X-axis direction is taken as a Y-axis direction. In the example, the direction from the second magnetic layer 12 toward the first magnetic layer 11 corresponds to the Z-axis direction.

Multiple sensor portions (e.g., a second sensor portion 52, a third sensor portion 53, a sensor portion 51P, a sensor portion 52P, a sensor portion 53P, etc.) are provided in the example. In the example, at least a portion of the second sensor portion 52 overlaps at least a portion of the first sensor portion 51 along the X-axis direction. The first sensor portion 51 is provided between the second sensor portion 52 and the third sensor portion 53. At least a portion of the sensor portion 51P overlaps at least a portion of the first sensor portion 51 along the Y-axis direction. At least a portion of the sensor portion 52P overlaps at least a portion of the second sensor portion 52 along the Y-axis direction. At least a portion of the sensor portion 53P overlaps at least a portion of the third sensor portion 53 along the Y-axis direction.

The second sensor portion 52 includes a third magnetic layer 13, a fourth magnetic layer 14, and a second intermediate layer 12*i*. The fourth magnetic layer 14 is provided between the first film 71 and the third magnetic layer 13. The second intermediate layer 12*i* is provided between the third magnetic layer 13 and the fourth magnetic layer 14.

The third sensor portion 53 includes a fifth magnetic layer 15, a sixth magnetic layer 16, and a third intermediate layer 13*i*. The sixth magnetic layer 16 is provided between the first film 71 and the fifth magnetic layer 15. The third intermediate layer 13*i* is provided between the fifth magnetic layer 15 and the sixth magnetic layer 16.

The configurations of the sensor portions 51P to 53P are similar to those of the first to third sensor portions 51 to 53.

As shown in FIG. 1D, the magnetic layers recited above are provided between a first sensor conductive layer 58*e* and the first film 71. A second sensor conductive layer 58*f* is provided between the first film 71 and the magnetic layers recited above.

The first sensor conductive layer 58*e* that is electrically connected to the first sensor portion 51 is electrically connected to a first sensor electrode EL1. The second sensor conductive layer 58*f* that is electrically connected to the first sensor portion 51 is electrically connected to a second sensor electrode EL2.

The magnetization of at least one of the first magnetic layer 11 or the second magnetic layer 12 changes according to the deformation of the first film 71. The angle between the magnetization of the first magnetic layer 11 and the magnetization of the second magnetic layer 12 changes according to the deformation of the first film 71. The electrical resistance between the first magnetic layer 11 and the second magnetic layer 12 (the electrical resistance of the first sensor portion 51) changes due to the change of this angle. For example, the pressure that is applied to the first film 71 can be sensed by sensing the change of the electrical resistance between the first sensor electrode EL1 and the second sensor electrode EL2. The pressure is, for example, a sound wave, etc.

In the embodiment, the state of being electrically connected includes not only the state in which multiple conductors are in direct contact, but also the case where the multiple conductors are connected via another conductor. The state of being electrically connected includes the case where multiple conductors are connected via an element having a function such as switching, amplification, etc.

For example, at least one of a switch element or an amplifier element may be inserted into at least one of, for example, the current path between the first sensor electrode EL1 and the first magnetic layer 11, or the current path between the second sensor electrode EL2 and the second magnetic layer 12.

For example, the first magnetic layer 11 is a free magnetic layer; and the second magnetic layer 12 is a magnetization reference layer. For example, the first magnetic layer 11 may be a magnetization reference layer; and the second magnetic layer 12 may be a free magnetic layer. Both the first magnetic layer 11 and the second magnetic layer 12 may be free magnetic layers. The description relating to the first sensor portion 51 recited above is applicable also to the other sensor portions (the second sensor portion 52, the third sensor portion 53, the sensor portion 51P, the sensor portion 52P, the sensor portion 53P, etc.).

The first element portion 41 includes a first piezoelectric layer 41c. The first piezoelectric layer 41c is fixed to the first film 71. The first piezoelectric layer 41c overlaps the first film 71 in the first direction (the Z-axis direction).

The first piezoelectric layer 41c includes, for example, at least one of PZT (lead zirconate titanate), AlN, ZnO, KNN ((K, Na)NbO$_3$), BaTiO$_3$, or BiFeO$_3$. The first piezoelectric layer 41c may include a polymer.

In the example, the first element portion 41 further includes a first element conductive layer 41e and a second element conductive layer 41f. The first piezoelectric layer 41c is provided between the first element conductive layer 41e and the first film 71. The second element conductive layer 41f is provided between the first piezoelectric layer 41c and the first film 71.

In the example as shown in FIG. 1A, an insulating layer 41i is provided in the region between the first element conductive layer 41e and the second element conductive layer 41f where the first piezoelectric layer 41c is not provided.

For example, a voltage is applied to the first piezoelectric layer 41c when a voltage Va is applied between the first element conductive layer 41e and the second element conductive layer 41f. Strain is generated in the first piezoelectric layer 41c according to the voltage. The first film 71 can be deformed by the strain.

As shown in FIG. 1A and FIG. 1B, the sensor 110 may further include a controller 60. The controller 60 is electrically connected to the first element portion 41 and supplies a first signal Sig1 to the first element portion 41. For example, the controller 60 is electrically connected to the first element conductive layer 41e and the second element conductive layer 41f. The first signal Sig1 includes the voltage Va recited above.

The controller 60 may be electrically connected to the sensor portions (the first sensor portion 51, etc.). The controller 60 is electrically connected to the first sensor electrode EL1 and the second sensor electrode EL2.

For example, the change of the electrical resistance with respect to the strain (the stress) is large for the sensor portions (the first sensor portion 51, etc.) that use the magnetic layers. In other words, the sensitivity is high. However, there are cases where the range of the strain (the stress) obtained with high sensitivity is relatively narrow.

In such a case, in the embodiment, the strain of the first film 71 is controlled by applying a prescribed stress to the first film 71 by the first element portion 41. Thereby, the sensible range of the stress (e.g., the sound wave, etc.) to be sensed can be controlled. Thereby, for example, the stress in the desired range can be sensed with high precision.

For example, there are cases where strain (initial strain) is generated in the films provided in the manufacturing processes of the sensor. For example, strain may be generated in the first film 71 even in the case where there is substantially no stress (sound waves, etc.) to be sensed. In such a case, the strain of the first film 71 when the stress (the sound wave, etc.) to be sensed is applied to the first film 71 may be outside the range of the strain that can be sensed with high sensitivity by the sensor portion.

In such a case, in the embodiment, the strain (the initial strain) of the first film 71 can be reduced by applying a prescribed stress to the first film 71 by the first element portion 41. Thereby, the state of the strain of the first film 71 generated when the stress (e.g., the sound wave, etc.) to be sensed is applied to the first film 71 can be within the range of the strain that can be sensed with high sensitivity by the sensor portion. Thereby, the desired stress can be sensed with high precision.

Thus, according to the embodiment, a sensor can be provided in which the sensing precision can be increased.

On the other hand, for example, there is a first reference example of a sensor including a sensor portion using a piezoelectric layer in which the strain of the film is controlled by applying stress to the film by an element portion using a piezoelectric layer. In such a case, both the sensor portion for the sensing and the element portion for controlling the strain of the film include piezoelectric materials. Because the sensor portion and the element portion include piezoelectric materials having similar characteristics, the characteristics of the sensor portion cannot be sufficiently high to obtain sufficient controllability of the element portion. On the other hand, the characteristics of the element portion cannot be sufficiently high to obtain sufficient controllability of the sensor portion. Thus, in the case where similar materials are used in the sensor portion and the element portion and the materials operate using similar mechanisms, the characteristics that can be obtained are limited.

For example, a second reference example also may be considered in which a sensor portion that senses the pressure based on the change of the electrostatic capacitance and a sensor portion that controls the shape of the film based on the electrostatic force are combined. In such a case as well, the characteristics that can be obtained are limited because the sensor portion and the element portion operate using similar mechanisms.

In the first and second reference examples recited above that use similar mechanisms, layers of similar materials are provided in the sensor portion and the element portion. In such a case, for example, similar stress (strain) is generated in these layers in the manufacturing processes. Therefore, the characteristics of the layers included in the element portion are similar to the characteristics of the layers included in the sensor portion. Therefore, the control of the strain of the film by the element portion is limited.

Conversely, in the embodiment, the sensor portions (the first sensor portion 51, etc.) sense the strain (the pressure) based on the inverse magnetostrictive effect and the magnetoresistance effect using magnetic layers. On the other hand, the first element portion 41 that uses the first piezoelectric layer 41c applies stress Pc to the first film 71 based on the piezoelectric property. The sensor portion and the element portion operate based on mutually-different mechanisms. Therefore, for example, the configuration of the first element portion 41 can be set and the first element portion 41 can be controlled from the perspective of controlling the strain of the first film 71. In other words, the configuration of the first element portion 41 can be determined and the first element portion 41 can be controlled independently from the operation of the sensor portion. Therefore, the characteristics that are obtained are improved easily compared to the reference examples recited above.

Thus, in the embodiment, the sensing precision can be increased further by using the first element portion 41 operating based on a mechanism that is different from that of the sensor portion including the magnetic layers.

An example of the characteristics of the sensor portion will now be described.

FIG. 2 is a graph illustrating the characteristics of the sensor according to the first embodiment.

The horizontal axis of FIG. 2 shows a strain ε (per mille, 1/1000) applied to the sensor portion (the first sensor portion 51). The strain ε corresponds to the strain generated in the first film 71. The strain ε corresponds to the magnitude of the stress (the sound wave, etc.) to be sensed. The vertical axis is an electrical resistance Rs (Ω) of the first sensor portion 51. In the figures, the cases where a first material MT1 and a second material MT2 are used as the free magnetic layer of the first sensor portion 51 are shown. The gauge factor of the first material MT1 is 1500. The gauge factor of the second material MT2 is 4000.

In the example, the change of the electrical resistance Rs with respect to the strain ε is higher for the second material MT2 than for the first material MT1. In other words, the sensitivity is high. In either of these materials, a large change of the electrical resistance Rs is obtained when the strain ε is not 0. In other words, the sensitivity of the sensing of the stress is low when the stress to be sensed is small.

For example, it is considered that such a phenomenon is caused by the stress (the initial strain) generated in the films in the manufacturing processes. It is considered that the initial strain is dependent on the configurations of the multiple films, the materials of the multiple films, the manufacturing conditions of the multiple films, various conditions in the manufacturing process, etc. There are cases where the initial strain is not constant. Therefore, there are cases where it is difficult to stably sense the stress to be sensed with high precision. The embodiment can solve such a condition.

Figure 3A:
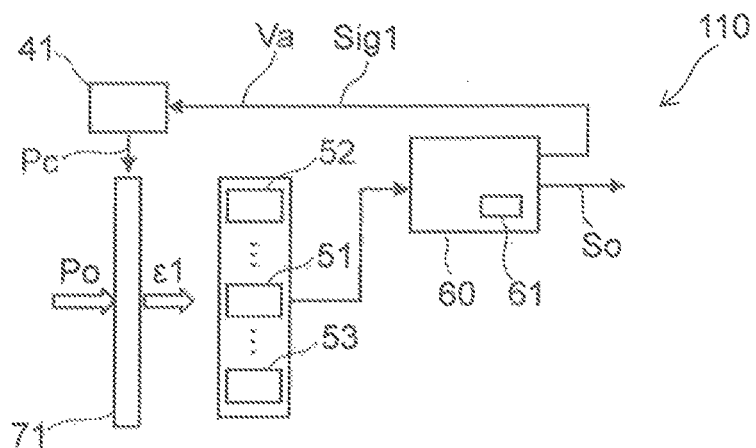
FIG. 3A to FIG. 3C are schematic views illustrating operations of the sensor according to the first embodiment.
Figure 3B:
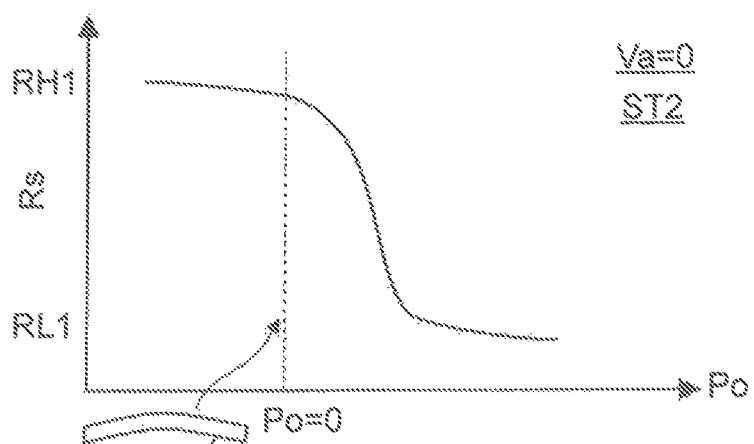
Figure 3C:
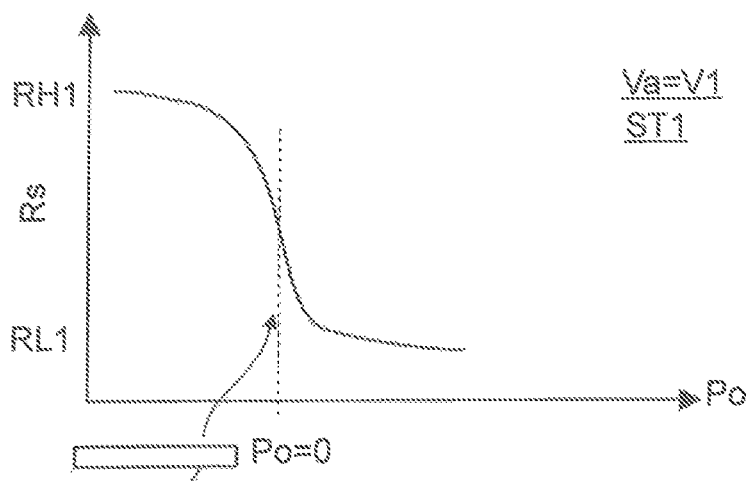

FIG. 3A to FIG. 3C are schematic views illustrating operations of the sensor according to the first embodiment.

As shown in FIG. 3A, the pressure Po to be sensed is applied to the first film 71. Thereby, a first strain ε1 is generated. A change of the electrical resistance occurs in the sensor portions (the first to third sensor portions 51 to 53, etc.) due to the first strain ε1. For example, two or more of these sensor portions may be connected in series. The change of the electrical resistance is sensed by the controller 60. The controller 60 sets the first signal Sig1 (the voltage Va) according to the electrical resistance of the sensor portion (e.g., the electrical resistance between the first magnetic layer 11 and the second magnetic layer 12). The stress Pc is applied to the first film 71 from the first element portion 41 by the application of the first signal Sig1. The state of the strain of the first film 71 changes due to the stress Pc. The first film 71 can be set to the desired state by the appropriate first signal Sig1 (the voltage Va); and the pressure Po to be sensed can be sensed with high precision by the sensor portion. The sensing results are output as an output So.

FIG. 3B illustrates the characteristics when the voltage Va is 0. The horizontal axis is the pressure Po to be sensed. The vertical axis is the electrical resistance Rs of the sensor portion (e.g., the first sensor portion 51).

As shown in FIG. 3B, the electrical resistance Rs changes according to the pressure Po to be sensed. However, when the pressure Po is substantially 0, the change rate of the electrical resistance Rs is low; and the sensitivity is low. For example, it is considered that this is because the initial strain is generated when the pressure Po is substantially 0.

FIG. 3C illustrates the characteristics when the voltage Va (the first signal Sig1) is a first voltage V1. As shown in FIG. 3C, in such a case as well, the electrical resistance Rs changes according to the pressure Po to be sensed. By setting the voltage Va appropriately, a high change rate of the electrical resistance Rs is obtained when the pressure Po is substantially 0. For example, it is considered that this is because the initial strain when the pressure Po is substantially 0 is small due to the first voltage V1.

Thus, in the embodiment, the first element portion 41 has a first state ST1 in which the first signal Sig1 is input (the state of FIG. 3C), and a second state ST2 (the state of FIG. 3B). The second state ST2 is a state that is different from the first state ST1. As shown in FIG. 3B and FIG. 3C, the shape of the first film 71 in the first state ST1 is different from the shape of the first film 71 in the second state ST2. These shapes are, for example, the cross-sectional shapes of the first film 71 when the first film 71 is cut by a plane including the Z-axis direction. These shapes are the strain of the first film 71. The pressure Po (the sound wave or the like) that is applied to the first film 71 from the outside is the same for these states. For example, the pressure Po is 0 in these states.

For example, in the embodiment, the first signal Sig1 (the first voltage V1) may be determined as follows. For example, the electrical resistance Rs of the first sensor portion 51 is measured by changing the voltage Va. A maximum value RH1 and a minimum value RL1 of the electrical resistance Rs are obtained from this result. Then, when the pressure Po (e.g., the sound wave) to be sensed is substantially 0, the first signal Sig1 (the first voltage V1) is determined so that the electrical resistance Rs of the first sensor portion 51 is set to the average (e.g., the arithmetic average) of the maximum value RH1 and the minimum value RL1. For example, such an operation is performed by the controller 60.

The controller 60 may include a memory unit 61 (e.g., nonvolatile memory). For example, the first voltage V1 is stored in the memory unit 61.

An example of other operations of the controller 60 will now be described.

Figure 4A:
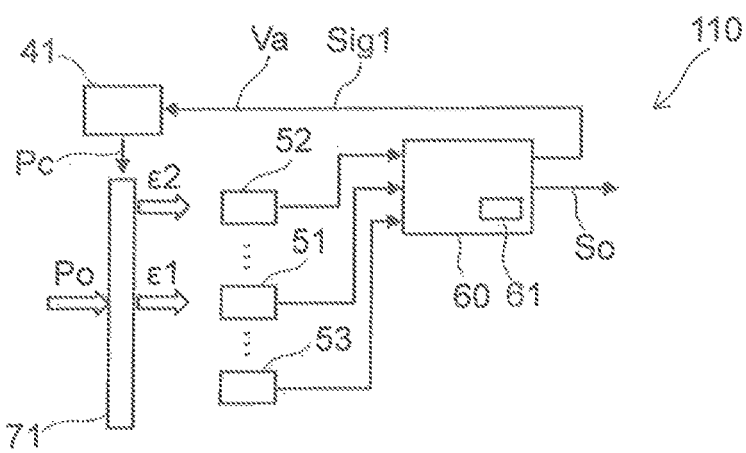
FIG. 4A to FIG. 4C are schematic views illustrating other operations of the sensor according to the first embodiment.
Figure 4B:
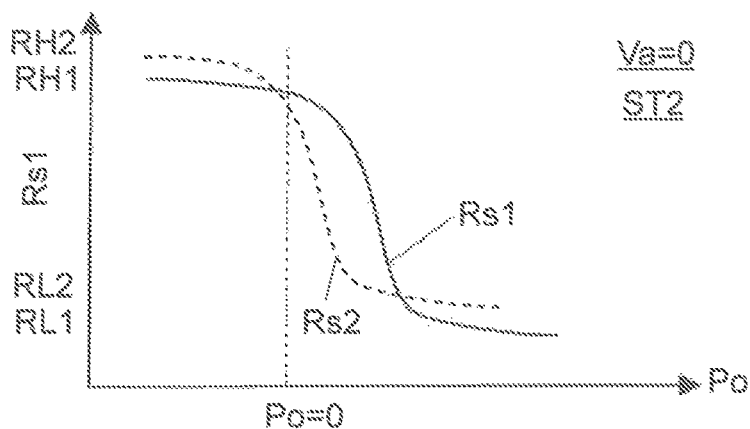
Figure 4C:
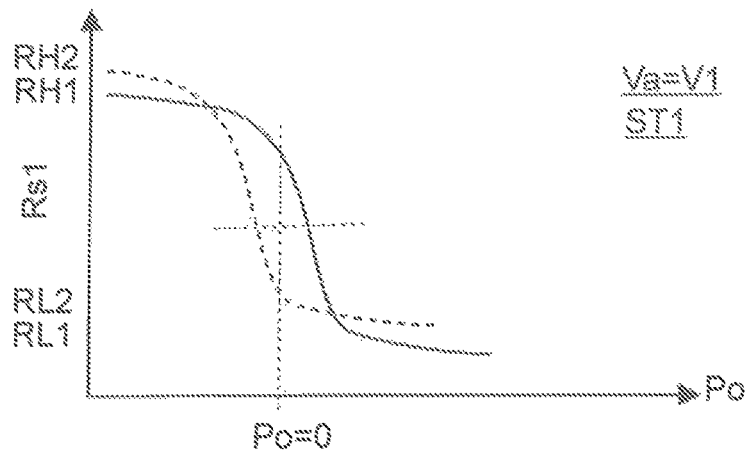

FIG. 4A to FIG. 4C are schematic views illustrating other operations of the sensor according to the first embodiment.

As shown in FIG. 4A, operations such as those recited below may be performed in the case where multiple sensor portions (the first sensor portion 51, the second sensor portion 52, the third sensor portion 53, etc.) are provided. An example is described in the following example in which the first sensor portion 51 and the second sensor portion 52 are used as the multiple sensor portions. The position (a second position) on the first film 71 where the second sensor portion 52 is provided is different from the position (a first position) on the first film 71 where the first sensor portion 51 is provided.

As shown in FIG. 4A, the pressure Po to be sensed is applied to the first film 71. Thereby, the first strain ε1 is generated at the first position; and a second strain ε2 is generated at the second position. In the first sensor portion 51, the electrical resistance that corresponds to the first strain ε1 is generated; and in the second sensor portion 52, the electrical resistance that corresponds to the second strain ε2 is generated. The changes of these electrical resistances are sensed by the controller 60. The controller 60 sets the first signal Sig1 (the voltage Va) according to the electrical resistances of the first sensor portion 51 and the second sensor portion 52. The stress Pc is applied to the first film 71 from the first element portion 41 by the application of the first signal Sig1. In such a case as well, the first film 71 can be set to the desired state; and the pressure Po to be sensed can be sensed with high precision.

For example, in the embodiment, the first signal Sig1 (the first voltage V1) may be determined as follows.

As shown in FIG. 4B, when the voltage Va is 0, a first electrical resistance Rs1 of the first sensor portion 51 and a second electrical resistance Rs2 of the second sensor portion 52 change with the pressure Po. The first electrical resistance Rs1 has the maximum value RH1 and the minimum value RL1. The second electrical resistance Rs2 has a maximum value RH2 and a minimum value RL2.

As shown in FIG. 4C, the voltage Va is set to the first voltage V1. For example, the first voltage V1 is determined as follows. When the pressure Po (e.g., the sound wave) to be sensed is substantially 0, the first signal Sig1 (the first voltage V1) is determined so that the average (the arithmetic average) of the first electrical resistance Rs1 and the second electrical resistance Rs2 becomes the average of the average of the maximum value RH1 and the minimum value RL1 and the average of the maximum value RH2 and the minimum value RL2. For example, such an operation is performed by the controller 60.

Another example of the sensor according to the embodiment will now be described.

Figure 5A:
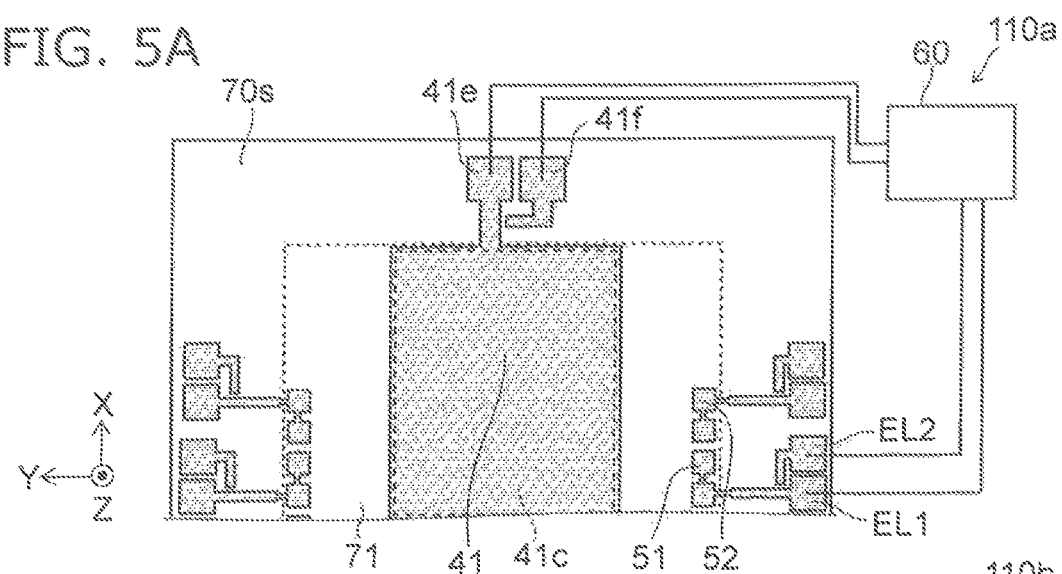
FIG. 5A to FIG. 5C are schematic plan views illustrating other sensors according to the first embodiment.
Figure 5B:
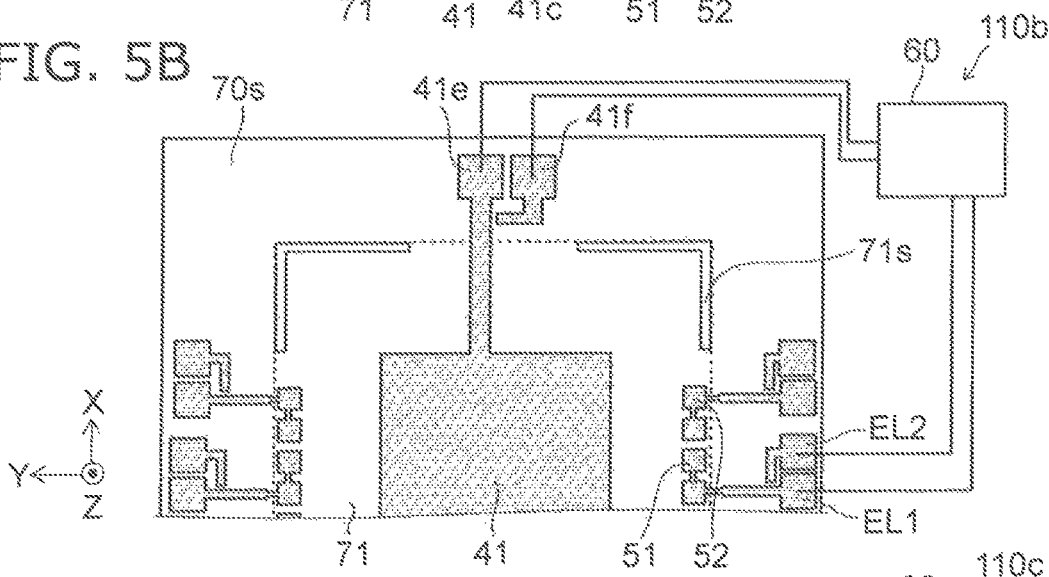
Figure 5C:
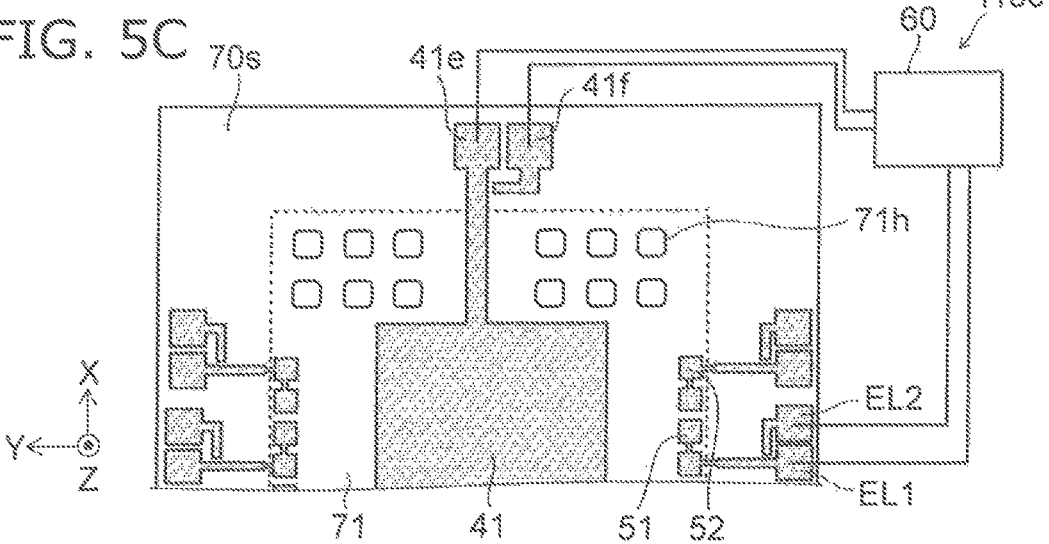

FIG. 5A to FIG. 5C are schematic plan views illustrating other sensors according to the first embodiment.

In a sensor 110a as shown in FIG. 5A, the end portion of the first piezoelectric layer 41c of the first element portion 41 substantially overlaps the end portion of the first film 71. As shown in FIG. 5B, a silt 71s is provided between the support portion 70s and a portion of the first film 71. As shown in FIG. 5C, a hole 71h is provided in the first film 71. The hole 71h may be multiple holes. Thus, various modifications are possible in the embodiment.

Figure 6A:
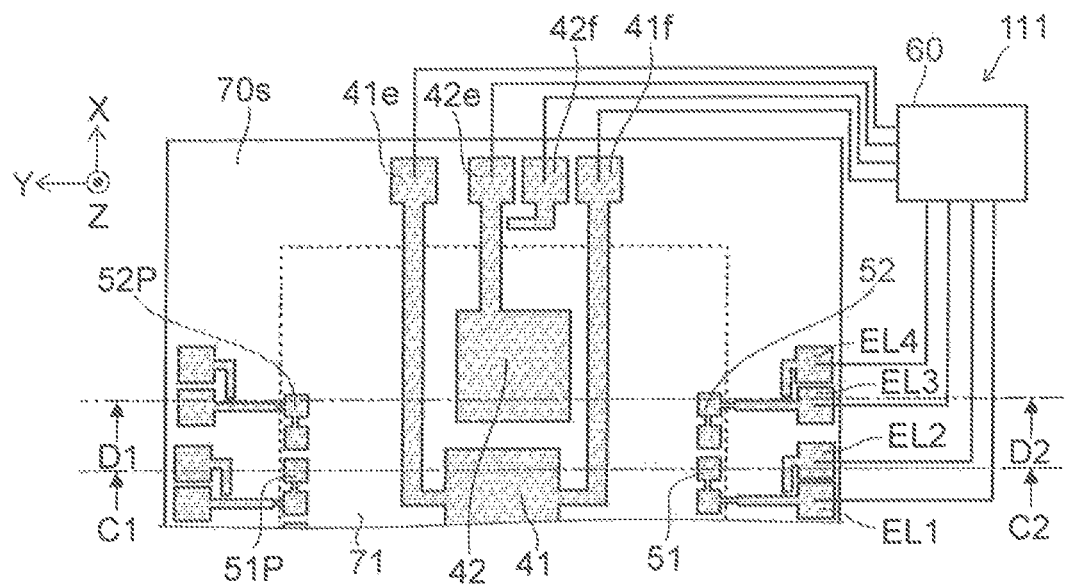
FIG. 6A to FIG. 6C are schematic views illustrating another sensor according to the first embodiment.
Figure 6B:
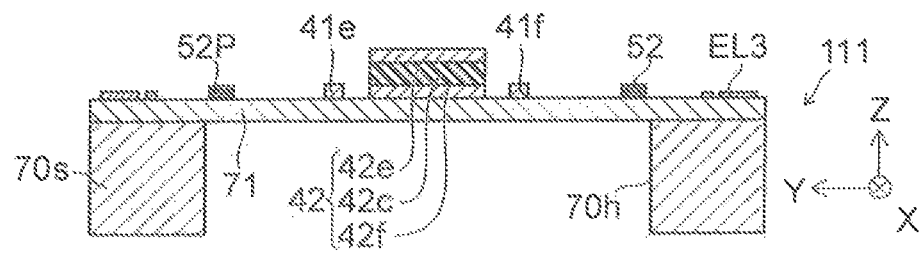
Figure 6C:
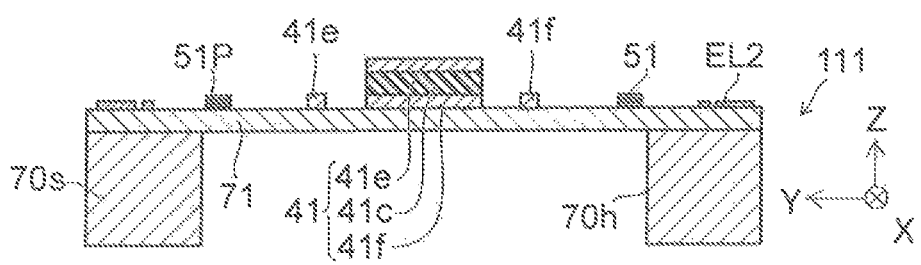

FIG. 6A to FIG. 6C are schematic views illustrating another sensor according to the first embodiment.

FIG. 6A is a plan view illustrating a portion of the sensor 111 according to the embodiment. FIG. 6B is a line D1-D2 cross-sectional view of FIG. 6A. FIG. 6C is a line C1-C2 cross-sectional view of FIG. 6A.

As shown in FIG. 6A, the sensor 111 includes the second sensor portion 52 and a second element portion 42 in addition to the first film 71, the first sensor portion 51, and the first element portion 41.

The second sensor portion 52 is provided at the first film 71. As described in reference to FIG. 1D, the second sensor portion 52 includes the third magnetic layer 13, the fourth magnetic layer 14, and the second intermediate layer 12i. As described above, the fourth magnetic layer 14 is provided between the first film 71 and the third magnetic layer 13. The second intermediate layer 12i is provided between the third magnetic layer 13 and the fourth magnetic layer 14.

The second sensor portion 52 is separated from the first sensor portion 51 in a second direction (in the example, the X-axis direction) crossing the first direction. The second sensor portion 52 is electrically connected to a third sensor electrode EL3 and a fourth sensor electrode EL4.

The second element portion 42 includes a second piezoelectric layer 42c. The second piezoelectric layer 42c overlaps the first film 71 in the first direction (the Z-axis direction). In the example, the second element portion 42 further includes a third element conductive layer 42e and a fourth element conductive layer 42f. The second piezoelectric layer 42c is provided between the third element conductive layer 42e and the first film 71. The fourth element conductive layer 42f is provided between the second piezoelectric layer 42c and the first film 71.

The first element portion 41 is arranged with at least a portion of the first sensor portion 51 in a third direction (in the example, the Y-axis direction) crossing the first direction and the second direction. The second element portion 42 is arranged with at least a portion of the second sensor portion 52 in the third direction.

For example, the controller 60 is electrically connected to the first to fourth sensor electrodes EL1 to EL4. The controller 60 is electrically connected to the first element conductive layer 41e, the second element conductive layer 41f, the third element conductive layer 42e, and the fourth element conductive layer 42f.

For example, the strain in the region of the first film 71 where the first sensor portion 51 is provided is controlled by the first element portion 41. For example, the strain in the region of the first film 71 where the second sensor portion 52 is provided is controlled by the second element portion 42. Thereby, the controllability of the strain of the first film 71 is higher.

FIG. 7A to FIG. 7E are schematic views illustrating the operations of the other sensor according to the first embodiment.

Figure 7A:
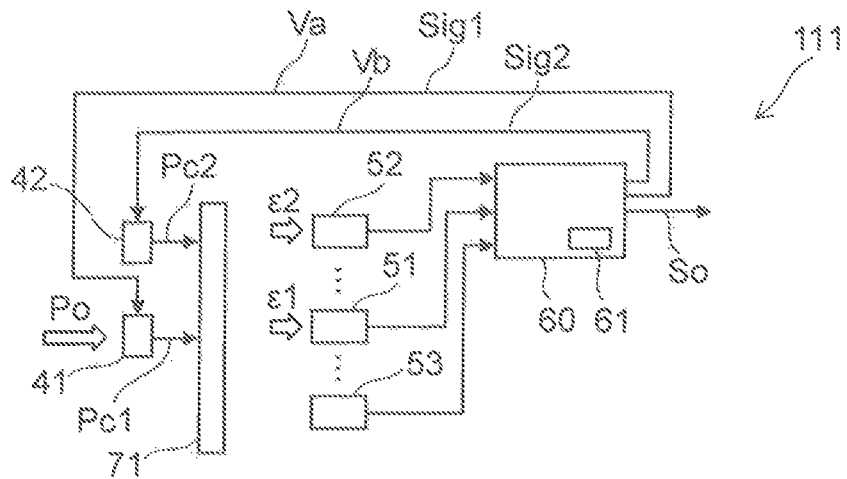
FIG. 7A to FIG. 7E are schematic views illustrating the operations of the other sensor according to the first embodiment.

As shown in FIG. 7A, in the case where the multiple sensor portions (the first sensor portion 51, the second sensor portion 52, the third sensor portion 53, etc.) are provided, operations such as those recited below may be performed. An example is described in the following example in which the first sensor portion 51 and the second sensor portion 52 are used as the multiple sensor portions. The position (the second position) of the first film 71 where the second sensor portion 52 is provided is different from the position (the first position) of the first film 71 where the first sensor portion 51 is provided.

As shown in FIG. 7A, the pressure Po to be sensed is applied to the first film 71. Thereby, the first strain ε1 is generated at the first position; and the second strain ε2 is generated at the second position. The change of the electrical resistance of the first sensor portion 51 and the change of the electrical resistance of the second sensor portion 52 are sensed by the controller 60. The controller 60 sets the first signal Sig1 (the voltage Va) and a second signal Slg2 (a voltage Vb) according to the electrical resistances of the first sensor portion 51 and the second sensor portion 52. Stress Pc1 is applied to the first film 71 from the first element portion 41 by the application of the first signal Sig1. Stress Pc2 is applied to the first film 71 from the second element portion 42 by the application of the second signal Sig2. By applying the signals corresponding to the positions of the multiple sensor portions to the first element portion 41 and the second element portion 42, the first film 71 can be set to the desired state; and the pressure Po to be sensed can be sensed with high precision. In the example, the first element portion 41 and the second element portion 42 are connected to the drive power source 41D (described later).

For example, in the embodiment, the first signal Sig1 and the second signal Sig2 may be determined as follows.

Figures 7B, 7C:
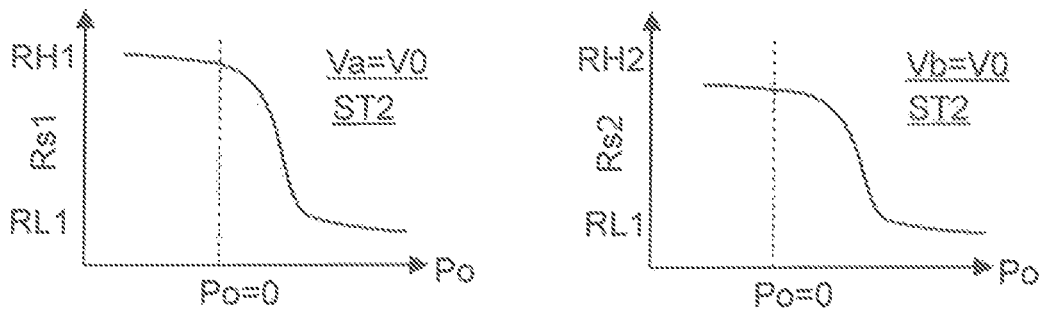
Figures 7D, 7E:
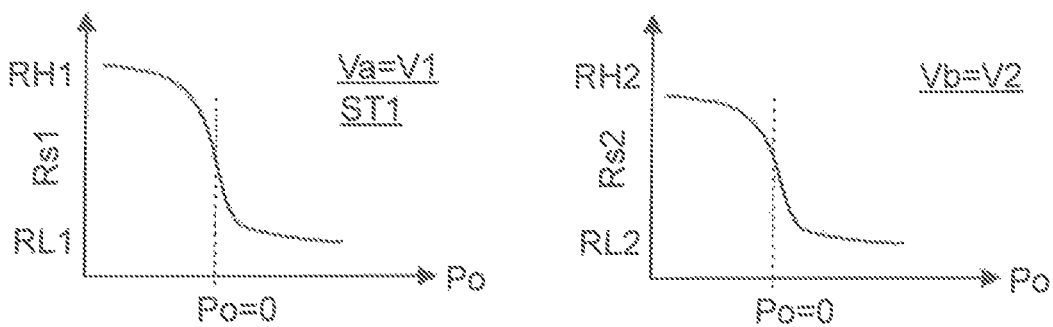

FIG. 7B illustrates the characteristic of the first sensor portion 51 when the voltage Va is 0. FIG. 7B illustrates the characteristic of the second sensor portion 52 when the voltage Vb is 0. FIG. 7C illustrates the characteristic of the first sensor portion 51 when the voltage Va (the first signal Sig1) is the first voltage V1. FIG. 7D illustrates the characteristic of the second sensor portion 52 when the voltage Vb (the second signal Sig2) is a second voltage V2. In these figures, the horizontal axis is the pressure Po to be sensed. The vertical axis is the electrical resistance Rs (the first electrical resistance Rs1 or the second electrical resistance Rs2) of the sensor portion.

As shown in FIG. 7B, the voltage Va is set to 0; and the change of the first electrical resistance Rs1 when changing the pressure Po to be sensed is determined. The maximum value RH1 and the minimum value RL1 of the first electrical resistance Rs1 are determined. As shown in FIG. 7C, the voltage Vb is set to 0; and the change of the second electrical resistance Rs2 when changing the pressure Po to be sensed is determined. The maximum value RH2 and the minimum value RL2 of the second electrical resistance Rs2 are determined.

As shown in FIG. 7D, for example, the first voltage V1 of the first signal Sig1 is determined as follows. The first voltage V1 is applied to the first element portion 41; and the first electrical resistance Rs1 is the average of the maximum value RH1 and the minimum value RL1 when the pressure Po is 0.

As shown in FIG. 7E, for example, the second voltage V2 of the second signal Sig2 is determined as follows. The second voltage V2 is applied to the second element portion 42; and the second electrical resistance Rs2 is the average of the maximum value RH2 and the minimum value RL2 when the pressure Po is 0.

In the sensor 111, multiple element portions are provided to correspond to the multiple sensor portions provided at the different multiple positions of the first film 71. By using the multiple element portions, the strain of the first film 71 can be controlled independently. Thereby, the controllability of the strain of the first film 71 is even higher.

Figure 8:
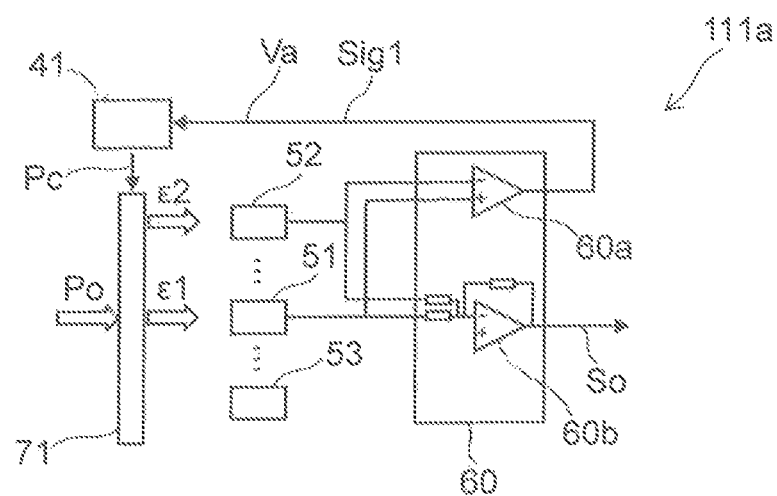
FIG. 8 is a schematic view illustrating another sensor according to the first embodiment.

FIG. 8 is a schematic view illustrating another sensor according to the first embodiment.

In the sensor 111a according to the embodiment as shown in FIG. 8, a differential circuit 60a and an adder circuit 60b are provided in the controller 60. For example, the output of the first sensor portion 51 and the output of the second sensor portion 52 are input to the differential circuit 60a. The output of the differential circuit 60a is input to the first element portion 41 as the first signal Sig1. For example, a voltage that corresponds to the difference between the output of the first sensor portion 51 and the output of the second sensor portion 52 is applied to the first element portion 41.

On the other hand, the output of the first sensor portion 51 and the output of the second sensor portion 52 are input to the adder circuit 60b. The output So of the adder circuit 60b is, for example, a value (e.g., the average) corresponding to the sum of the output of the first sensor portion 51 and the output of the second sensor portion 52.

In the sensor 111a, the memory unit 61 (referring to FIG. 3A) may be provided in the controller 60.

FIG. 9A to FIG. 9F are schematic cross-sectional views illustrating other sensors according to the first embodiment.

Figures 9A, 9B:
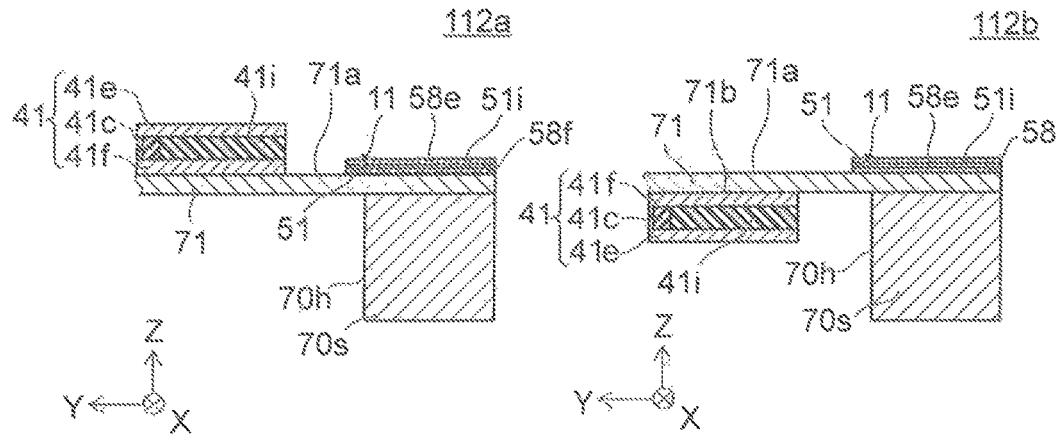
FIG. 9A to FIG. 9F are schematic cross-sectional views illustrating other sensors according to the first embodiment.

In a sensor 112a as shown in FIG. 9A, the first element portion 41 is provided in the first film 71. The first film 71 has a first surface 71a. In the example, the first element portion 41 and the first sensor portion 51 are provided at the first surface 71a.

As shown in FIG. 9A, an insulating layer 51i is provided between the first sensor conductive layer 58e and the second sensor conductive layer 58f. The insulating layer 51i is arranged with the magnetic layers (the first magnetic layer 11, etc.) In a direction crossing the first direction (the Z-axis direction).

As shown in FIG. 9B, the first film 71 has the first surface 71a and a second surface 71b. The second surface 71b is the surface opposite to the first surface 71a. In the sensor 112b, the first sensor portion 51 is provided at the first surface 71a. The first element portion 41 is provided at the second surface 71b.

Figures 9C, 9D:
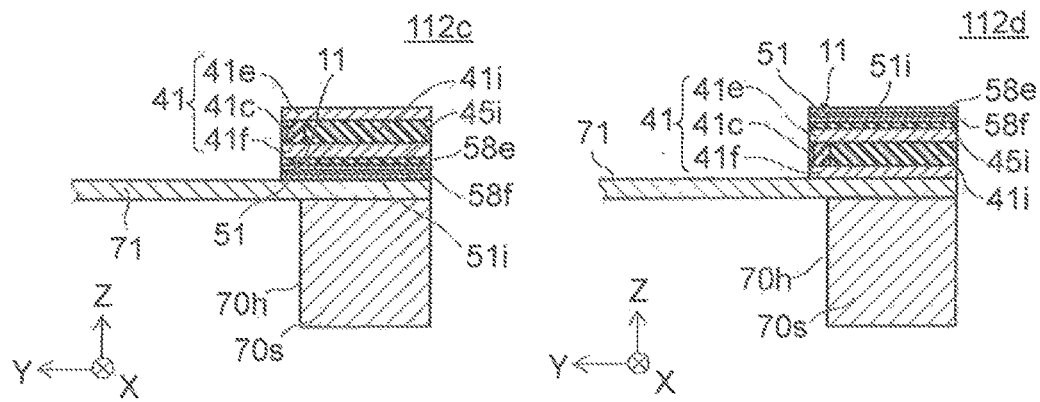

In a sensor 112c as shown in FIG. 9C, at least a portion of the first magnetic layer 11 is provided between the first film 71 and at least a portion of the first piezoelectric layer 41c in the first direction (the Z-axis direction).

In a sensor 112d as shown in FIG. 9D, at least a portion of the first piezoelectric layer 41c is provided between the first film 71 and at least a portion of the first magnetic layer 11 in the first direction (the Z-axis direction).

Figures 9E, 9F:
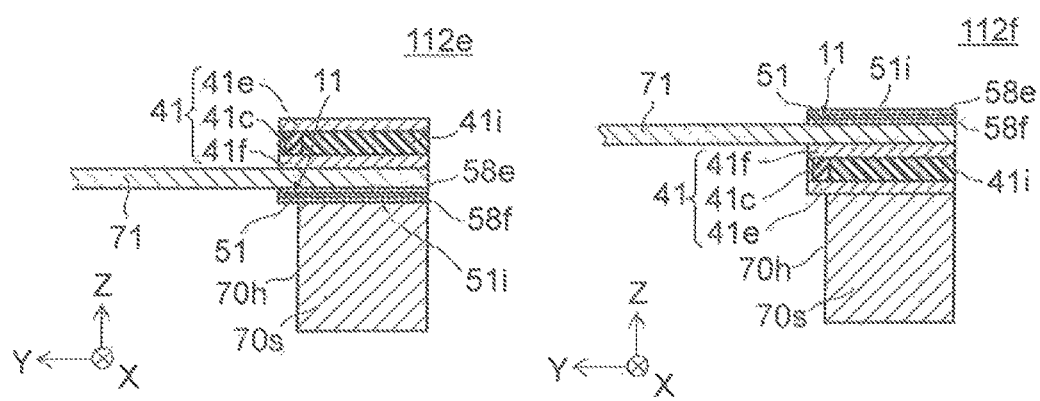

In a sensor 112e as shown in FIG. 9E, at least a portion of the first film 71 is provided between at least a portion of the first magnetic layer 11 and at least a portion of the first piezoelectric layer 41c in the first direction (the Z-axis direction). In the sensor 112e, the position in the Z-axis direction of the first magnetic layer 11 is between the position in the Z-axis direction of the support portion 70s and the position in the Z-axis direction of the first film 71.

In a sensor 112f as shown in FIG. 9F as well, at least a portion of the first film 71 is provided between at least a portion of the first magnetic layer 11 and at least a portion of the first piezoelectric layer 41c in the first direction (the Z-axis direction). In the sensor 112f, the position in the Z-axis direction of the first piezoelectric layer 41c is between the position in the Z-axis direction of the support portion 70s and the position in the Z-axis direction of the first film 71.

Figure 10A:
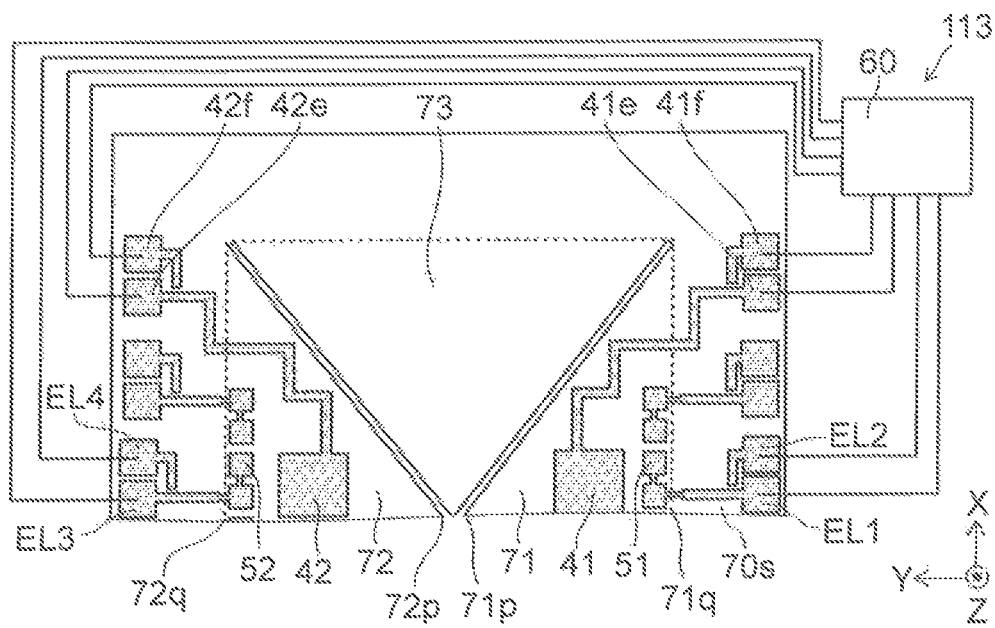
FIG. 10A to FIG. 10C are schematic views illustrating a portion of another sensor according to the first embodiment.
Figure 10B:
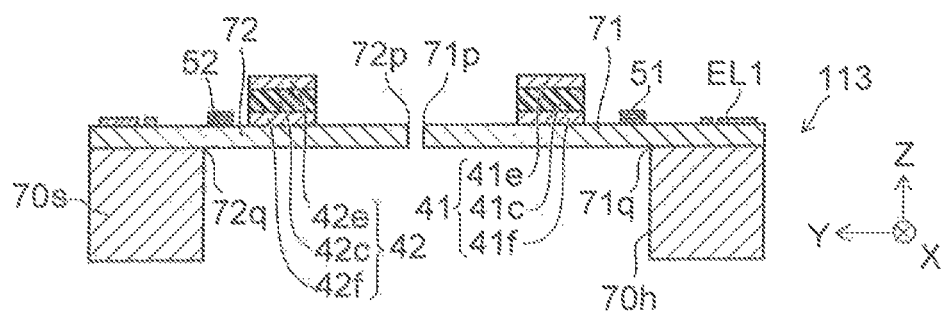
Figure 10C:
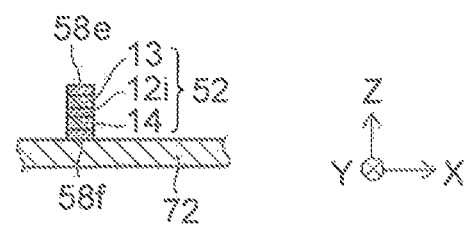

FIG. 10A to FIG. 10C are schematic views illustrating a portion of another sensor according to the first embodiment.

FIG. 10C is a plan view. FIG. 10B is a cross-sectional view. FIG. 10C is a cross-sectional view illustrating the second sensor portion 52.

In the other sensor 113 according to the embodiment as shown in FIG. 10A and FIG. 10B, the first film 71 has a fixed end 71q and a free end 71p (an unconstrained end). The fixed end 71q is connected to the support portion 70s. In the example, the free end 71p is arranged with the fixed end 71q in the Y-axis direction.

A second film 72 and a third film 73 are provided in the example. A not-illustrated fourth film may be further provided.

The second film 72 is deformable. The second film 72 also is supported by the support portion 70s. The second film 72 is arranged with the first film 71 in a direction (in the example, the Y-axis direction) crossing the first direction (the Z-axis direction). The second film 72 has a fixed end 72q and a free end 72p (an unconstrained end). The fixed end 72q is connected to the support portion 70s. In the example, the free end 72p is arranged with the fixed end 72q in the Y-axis direction.

The third film 73 and the not-illustrated fourth film are arranged in the X-axis direction and the Y-axis direction with the first film 71 and the second film 72. The fourth film is arranged with the third film 73 in the X-axis direction. The third film 73 and the fourth film also are deformable.

The sensor 113 includes the second sensor portion 52 in addition to the first sensor portion 51. The first sensor portion 51 is provided at the first film 71. The second sensor portion 52 is provided at the second film 72. The sensor 113 includes the second element portion 42 in addition to the first element portion 41. The first element portion 41 is provided at the first film 71. The second element portion 42 is provided at the second film 72.

As shown in FIG. 10C, the second sensor portion 52 includes the third magnetic layer 13, the fourth magnetic layer 14, and the second intermediate layer 12i. The fourth magnetic layer 14 is provided between the second film 72 and the third magnetic layer 13. The second intermediate layer 12i is provided between the third magnetic layer 13 and the fourth magnetic layer 14. In the example, the magnetic layers recited above are provided between the first sensor conductive layer 58e and the second film 72. The second sensor conductive layer 58f is provided between the magnetic layers recited above and the second film 72.

The second element portion 42 includes the second piezoelectric layer 42c. The second piezoelectric layer 42c overlaps the second film 72 in the first direction (the Z-axis direction). In the example, the second element portion 42 further includes the third element conductive layer 42e and the fourth element conductive layer 42f. The second piezoelectric layer 42c is provided between the third element conductive layer 42e and the second film 72. The fourth element conductive layer 42f is provided between the second piezoelectric layer 42c and the second film 72.

In the example, at least a portion of the first element portion 41 is arranged with the first sensor portion 51 in the direction recited above (the Y-axis direction) crossing the first direction (the Z-axis direction). At least a portion of the second element portion 42 is arranged with the second sensor portion 52 in the direction recited above (the Y-axis direction) crossing the first direction.

Thus, in the sensor 113, the deformable film is a "cantilever beam." In such a sensor 113 as well, a sensor can be provided in which the sensing precision can be increased.

Figure 11:
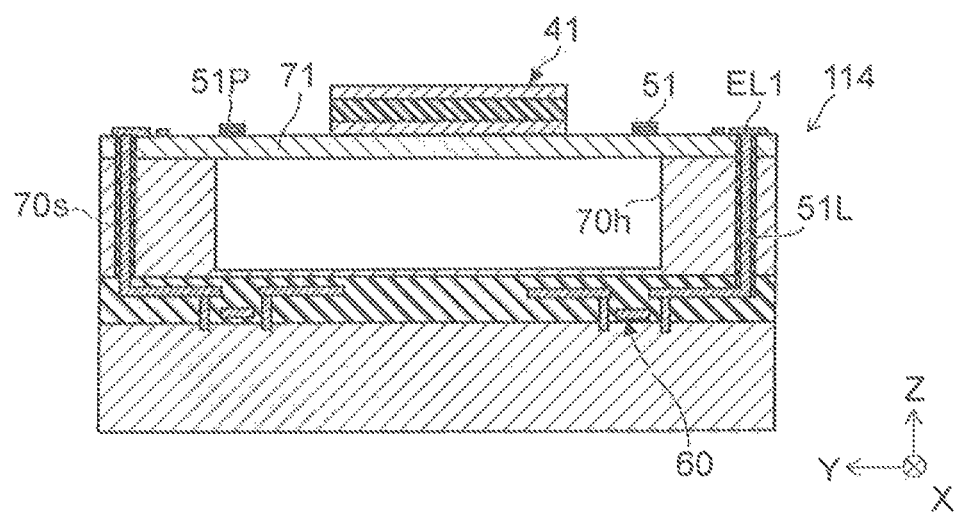
FIG. 11 is a schematic cross-sectional view illustrating a portion of another sensor according to the first embodiment.

FIG. 11 is a schematic cross-sectional view illustrating a portion of another sensor according to the first embodiment.

As in the sensor 114 shown in FIG. 11, at least a portion of the controller 60 may overlap at least one of the first sensor portion 51 or the first element portion 41 in the first direction (the Z-axis direction). The controller 60 may include, for example, a transistor. For example, the controller 60 may be connected to the first sensor portion 51 via an interconnect 51L, etc.

FIG. 12A to FIG. 12E are schematic cross-sectional views illustrating portions of the sensor according to the first embodiment.

Figure 12A:
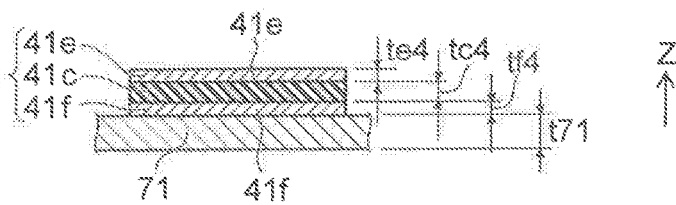
FIG. 12A to FIG. 12E are schematic cross-sectional views illustrating portions of the sensor according to the first embodiment.

FIG. 12A illustrates the first element portion 41. FIG. 12B to FIG. 12E illustrate the first sensor portion 51.

As shown in FIG. 12A, the first piezoelectric layer 41c has a thickness tc4. The first element conductive layer 41e has a thickness te4. The second element conductive layer 41f has a thickness tf4. The first film 71 has a thickness t1. These thicknesses are lengths along the first direction (the Z-axis direction). The thickness tc4 is, for example, not less than 1 μm and not more than 5 μm. The thickness te4 and the thickness tf4 each are, for example, not less than 0.1 μm and not more than 1 μm. The thickness t71 is, for example, not less than 0.3 μm and not more than 10 μm.

At least one of the first element conductive layer 41e or the second element conductive layer 41f includes, for example, at least one of Pt, Al, or Cu.

Figure 12B:
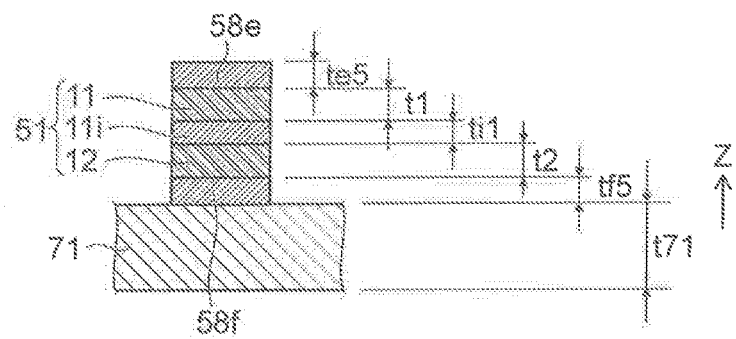

As shown in FIG. 12B, the first magnetic layer 11 has a thickness t1. The second magnetic layer 12 has a thickness t2. The first intermediate layer 11i has a thickness ti1. The first sensor conductive layer 58e has a thickness te5. The second sensor conductive layer 58f has a thickness tf5. These thicknesses are lengths along the first direction (the Z-axis direction). The thickness t1 is, for example, not less than 50 nm and not more than 700 nm. The thickness t2 is, for example, not less than 4 nm and not more than 50 nm. The thickness ti1 is, for example, not less than 0.6 nm and not more than 10 nm. The thickness te5 and the thickness tf5 each are, for example, not less than 2 nm and not more than 10 nm. For example, the distance between the first sensor conductive layer 58e and the second sensor conductive layer 58f (corresponding to the thickness of the magnetic sensing layers) is, for example, 200 nm or less.

For example, the thickness tc4 of the first piezoelectric layer 41c is, for example, not less than 5 times and not more than 100 times the distance between the first sensor conductive layer 58e and the second sensor conductive layer 58f.

Figure 12C:
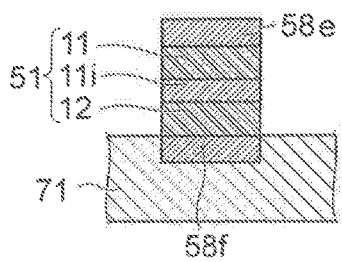
Figure 12D:
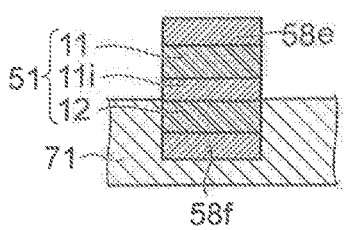
Figure 12E:
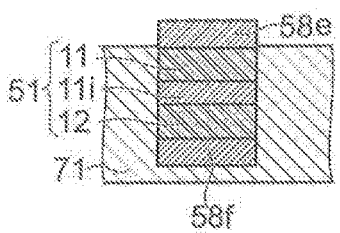

As shown in FIG. 12C, the second sensor conductive layer 58f may be buried in the first film 71. As shown in FIG. 12D, the second magnetic layer 12 may be buried in the first film 71. As shown in FIG. 12E, the first intermediate layer 11i and the first magnetic layer 11 may be buried in the first film 71. For example, at least one of the second sensor conductive layer 58f, the second magnetic layer 12, the first intermediate layer 11i, or the first magnetic layer 11 may overlap a portion of the first film 71 in a direction crossing the Z-axis direction.

The description relating to the first element portion 41 recited above is applicable also to the other element portions. The description relating to the first sensor portion 51 recited above is applicable also to the other sensor portions.

Examples of the materials included in the magnetic layers recited above, etc., are described below.

Second Embodiment

Figure 13A:
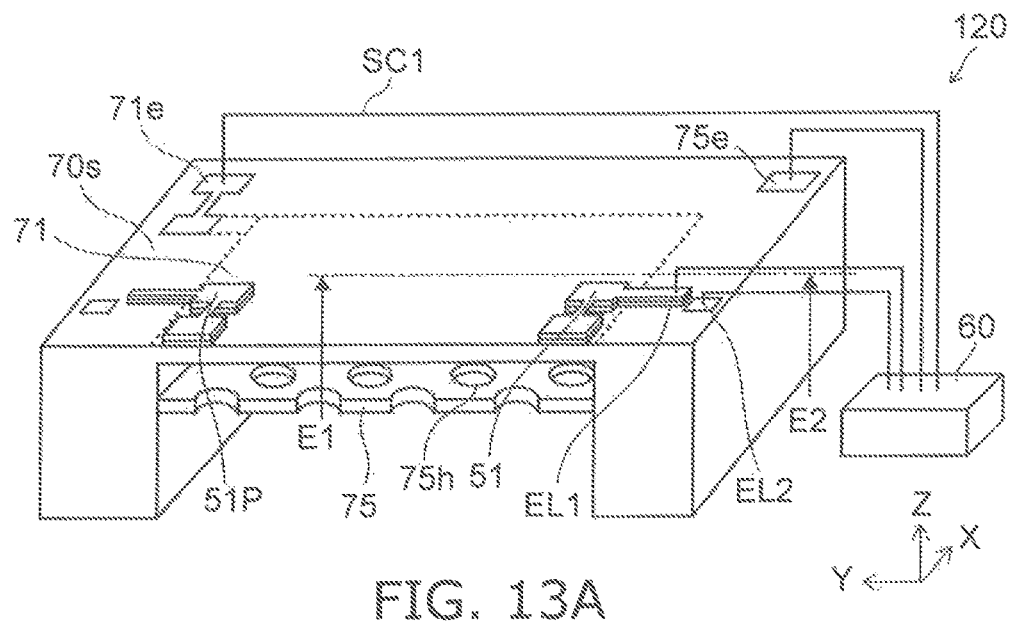
FIG. 13A to FIG. 13C are schematic views illustrating a sensor according to a second embodiment.
Figure 13B:
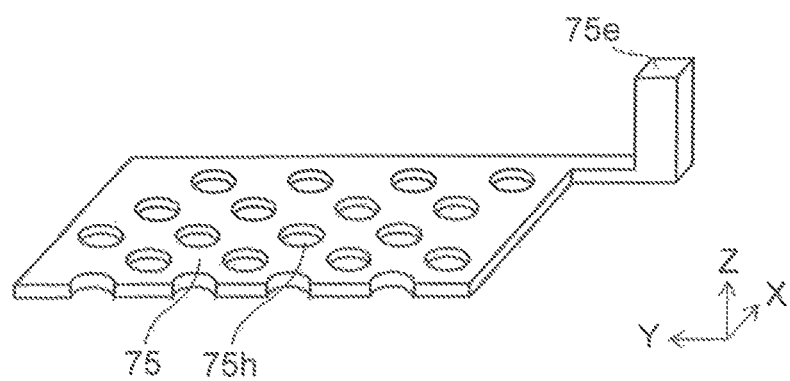
Figure 13C:
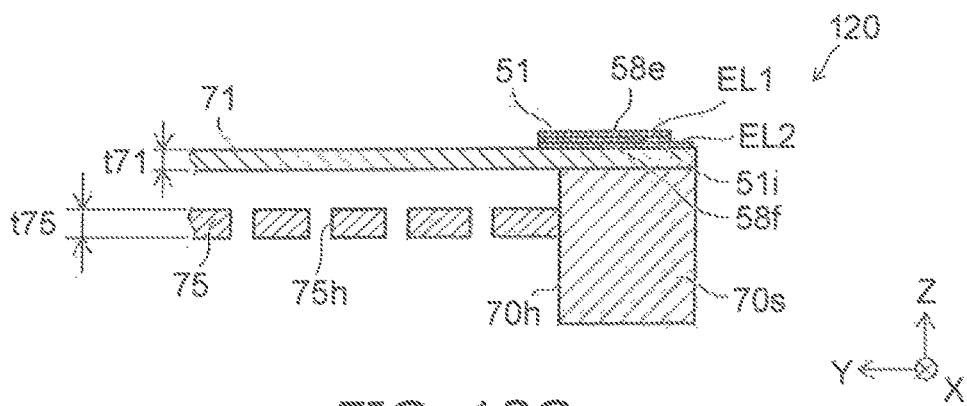

FIG. 13A to FIG. 13C are schematic views illustrating a sensor according to a second embodiment.

FIG. 13A is a perspective view. FIG. 13B is a perspective view in which a portion shown in FIG. 13A is drawn as being extracted. FIG. 13C is a line E1-E2 cross-sectional view of FIG. 13A.

As shown in FIG. 13A, the sensor 120 according to the embodiment includes the first film 71, a first opposing film 75, the first sensor portion 51, a first film electrode 71e, and a first opposing film electrode 75e.

FIG. 13A and FIG. 13B illustrate the configuration of the central portion in the X-axis direction of the sensor 120 when the sensor 120 is cut by the Z-Y plane for easier viewing of the drawing. In FIG. 13B, the first opposing film 75 and the first opposing film electrode 75e are drawn as being extracted.

The first film 71 is deformable. In the example as well, for example, the first film 71 is supported by the support portion 70s. The first sensor portion 51 is provided at the first film 71. The description of the first embodiment is applicable to the first film 71.

For example, as described in reference to FIGS. 1A to 1D, the first sensor portion 51 includes the first magnetic layer 11, the second magnetic layer 12 that is provided between the first film 71 and the first magnetic layer 11, and the first intermediate layer 11i that is provided between the first magnetic layer 11 and the second magnetic layer 12.

As shown in FIG. 13A, the first film electrode 71e is connected to the first film 71. For example, the connection includes an electrical connection.

As shown in FIG. 13B, the first opposing film electrode 75e is connected to the first opposing film 75. This connection also includes, for example, an electrical connection.

The first opposing film 75 includes a portion separated from the first film 71 in the first direction (e.g., the Z-axis direction) connecting the first film 71 and the first sensor portion 51. For example, at least a portion of the first opposing film 75 opposes the first film 71 in the Z-axis direction.

For example, the controller 60 is provided in the sensor 120. The controller 60 is electrically connected to the first film electrode 71e and the first opposing film electrode 75e. The controller 60 may be further electrically connected to the first sensor electrode EL1 and the second sensor electrode EL2. For example, the controller 60 applies a first control signal SC1 between the first film electrode 71e end the first opposing film electrode 75e. An electrostatic force acts between the first film 71 and the first opposing film 75 due to the first control signal SC1. For example, the distance between the first film 71 and the first opposing film 75 changes according to the first control signal SC1.

For example, the stress (the strain) that is applied to the first film 71 changes according to the first control signal SC1. The strain of the first film 71 can be controlled by controlling the first control signal SC1.

For example, the controller 60 may control the first control signal SC1 according to the electrical resistance (the first electrical resistance Rs1) between the first magnetic layer 11 and the second magnetic layer 12. Thereby, for example, the state of the strain of the first film 71 can be a state that is sensible with high precision by the first sensor portion 51.

For example, the first opposing film 75 may have a hole 75h. The hole 75h pierces the first opposing film 75 in the first direction (the Z-axis direction). Multiple holes 75h may be provided. For example, the first film 71 deforms when the pressure Po to be sensed is applied to the first film 71. At this time, pressure is applied to a gas (air, etc.) inside the space between the first film 71 and the first opposing film 75. At this time, the pressure is relaxed by providing the hole 75h. Thereby, the first film 71 deforms easily. The configuration of the hole 75h is arbitrary.

For example, the first opposing film 75 does not deform easily compared to the first film 71. Thereby, the strain of the first film 71 is controlled more easily. For example, the first film 71 has the thickness t71. The first opposing film 75 has a thickness t75. In the case where the material of the first film 71 is substantially the same as the material of the first opposing film 75, for example, the thickness t75 is set to be thinner than the thickness t71. The elastic modulus of the material of the first opposing film 75 may be higher than the elastic modulus of the material of the first film 71.

For example, the first opposing film 75 may have at least one of the thickness t75 thicker than the thickness t71 of the first film 71, or an elastic modulus higher than the elastic modulus of the first film 71.

In the sensor 120 as shown in FIG. 13C, the position in the Z-axis direction of the first film 71 is between the position in the Z-axis direction of the first sensor portion 51 and the position in the Z-axis direction of the first opposing film 75.

Figure 14A:
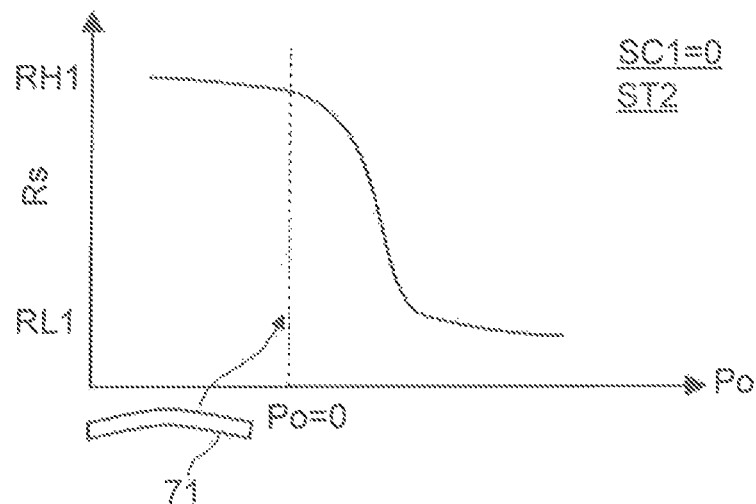
FIG. 14A and FIG. 14B are schematic views illustrating operations of the sensor according to the second embodiment.
Figure 14B:
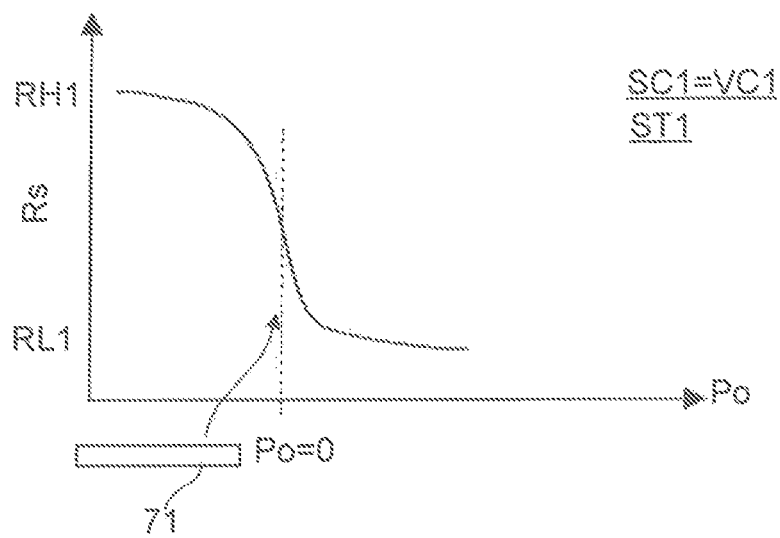

FIG. 14A and FIG. 14B are schematic views illustrating operations of the sensor according to the second embodiment.

FIG. 14A illustrates the characteristic when the magnitude (the absolute value) of the first control signal SC1 is 0. FIG. 14B illustrates the characteristic when the first control signal SC1 is a first voltage VC1. In these figures, the horizontal axis is the pressure Po to be sensed. The vertical axis is the electrical resistance Rs of the sensor portion (e.g., the first sensor portion 51).

As shown in FIG. 14A, when the pressure Po is substantially 0, the change rate of the electrical resistance Rs is low; and the sensitivity is low. For example, it is considered that this is because the initial strain is generated when the pressure Po is substantially 0.

In FIG. 14B, when the first control signal SC1 is the first voltage VC1, a high change rate of the electrical resistance Rs is obtained when the pressure Po is substantially 0. For example, it is considered that this is because the initial strain when the pressure Po is substantially 0 is small due to the first voltage VC1.

Thus, in the embodiment, the first film 71 has the second state ST2 shown in FIG. 14A and the first state ST1 shown in FIG. 14B. The first state ST1 is the state in which the first control signal SC1 (the first voltage, VC1) is applied between the first film electrode 71e and the first opposing film electrode 75e. The second state ST2 is a state that is different from the first state ST1. The shape of the first film 71 in the first state ST1 is different from the shape of the first film 71 in the second state ST2.

For example, these shapes are cross-sectional shapes of the first film 71 when the first film 71 is cut by a plane including the Z-axis direction. These shapes are the strain of the first film 71. The pressure Po (the sound wave or the like) that is applied to the first film 71 from the outside is the same for these states. For example, the pressure Po in these states is 0.

Thus, the shape of the first film 71 can be controlled by the first control signal SC1. The state of the strain of the first film 71 can be controlled by the first control signal SC1.

For example, in the embodiment, the first voltage VC1 of the first control signal SC1 may be determined as follows. For example, the electrical resistance Rs of the first sensor portion 51 is measured while changing the magnitude of the first control signal SC1. The maximum value RH1 and the minimum value RL1 of the electrical resistance Rs are obtained from this result. Then, when the pressure Po (e.g., the sound wave) to be sensed is substantially 0, the first voltage VC1 is determined so that the electrical resistance Rs of the first sensor portion 51 is the average (e.g., the arithmetic average) of the maximum value RH1 and the minimum value RL1. For example, such an operation is performed by the controller 60.

Figure 15:
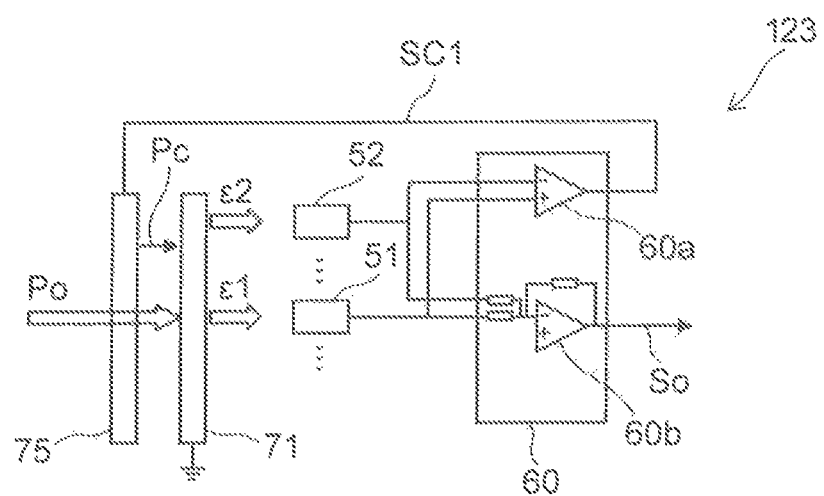
FIG. 15 is a schematic view illustrating another sensor according to the second embodiment.

FIG. 15 is a schematic view illustrating another sensor according to the second embodiment.

In the sensor 123 according to the embodiment as shown in FIG. 15, the differential circuit 60a and the adder circuit 60b are provided in the controller 60. For example, the output of the first sensor portion 51 and the output of the second sensor portion 52 are input to the differential circuit 60a. The output of the differential circuit 60a is applied between the first film 71 and the first opposing film 75 as the first control signal SC1. For example, a voltage corresponding to the difference between the output of the first sensor portion 51 and the output of the second sensor portion 52 is applied between the first film 71 and the first opposing film 75.

On the other hand, the output of the first sensor portion 51 and the output of the second sensor portion 52 are input to the adder circuit 60b. For example, the output So of the adder circuit 60b is a value (e.g., the average) corresponding to the sum of the output of the first sensor portion 51 and the output of the second sensor portion 52.

Figure 16A:
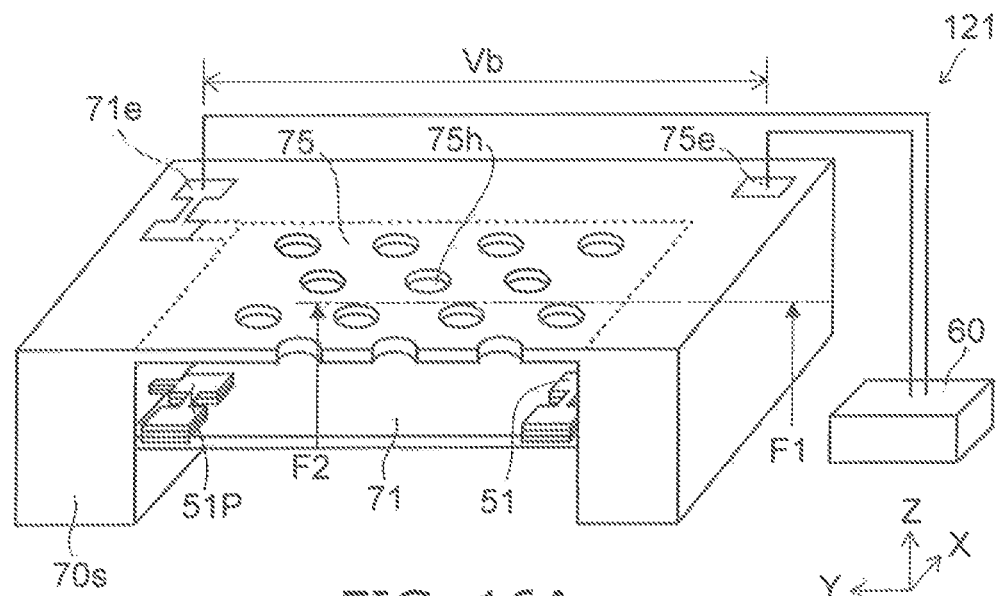
FIG. 16A to FIG. 16C are schematic views illustrating another sensor according to the second embodiment.
Figure 16B:
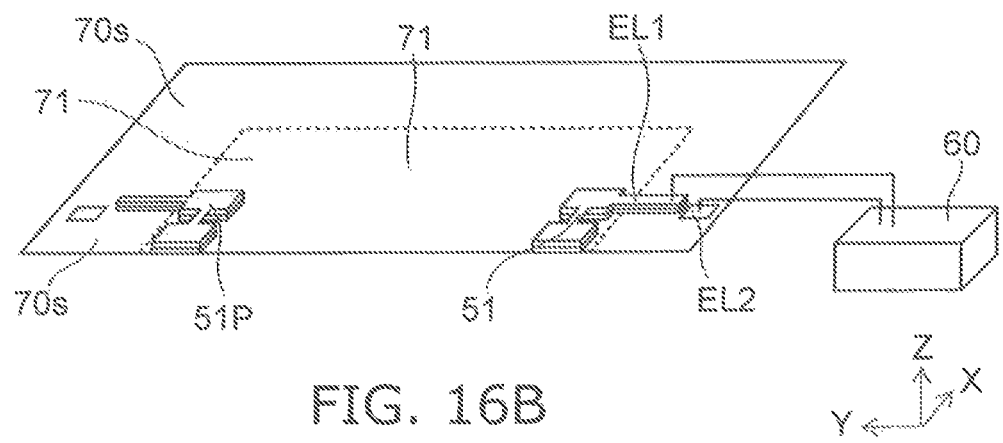
Figure 16C:
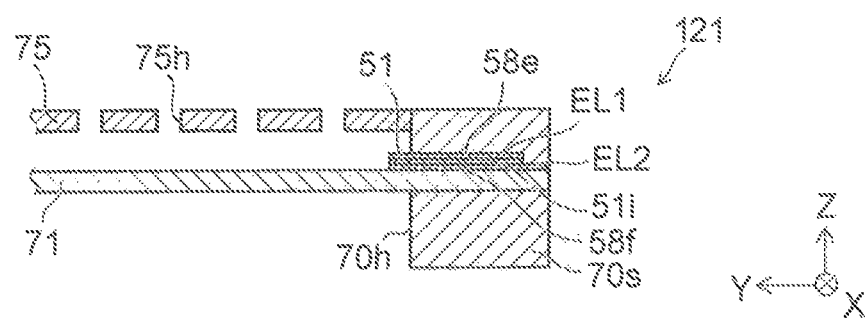

FIG. 16A to FIG. 16C are schematic views illustrating another sensor according to the second embodiment.

FIG. 16A is a perspective view. FIG. 16B is a perspective view in which a portion shown in FIG. 16A is drawn as being extracted. FIG. 16C is a line F1-F2 cross-sectional view of FIG. 16A.

As shown in FIG. 16A, the sensor 121 according to the embodiment also includes the first film 71, the first opposing film 75, the first sensor portion 51, the first film electrode 71e, and the first opposing film electrode 75e.

FIG. 16A and FIG. 16B illustrate the configuration of the central portion in the X-axis direction of the sensor 121 when the sensor 121 is cut by the Z-Y plane for easier viewing of the drawing. In FIG. 16B, the first opposing film 75 and the first opposing film electrode 75e are drawn as being extracted.

In the sensor 121 as shown in FIG. 16C, the position in the Z-axis direction of the first sensor portion 51 is between the position in the Z-axis direction of the first film 71 and the position in the Z-axis direction of the first opposing film 75. Otherwise, the sensor 121 is similar to the sensor 120.

Figure 17A:
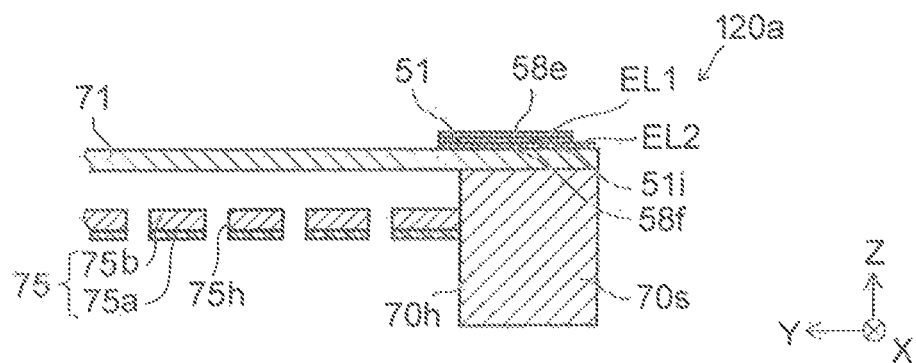
FIG. 17A and FIG. 17B are schematic cross-sectional views illustrating other sensors according to the second embodiment.
Figure 17B:
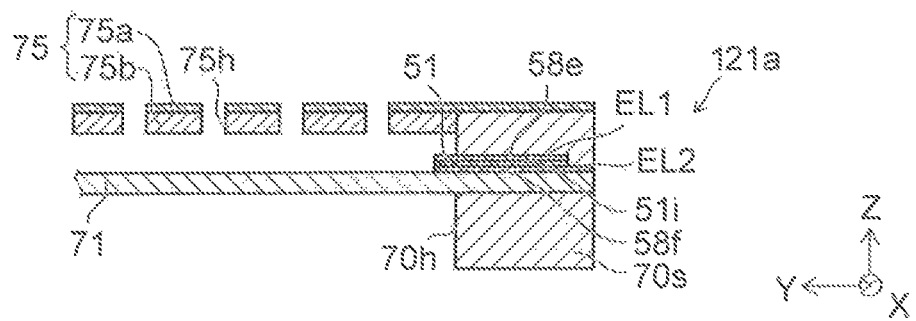

FIG. 17A and FIG. 17B are schematic cross-sectional views illustrating other sensors according to the second embodiment.

In a sensor 120a as shown in FIG. 17A, the multiple stacked films are provided at the first opposing film 75. Otherwise, the sensor 120a is similar to the sensor 120.

In the example, the first opposing film 75 includes a first material portion 75a and a second material portion 75b. The second material portion 75b overlaps the first material portion 75a in the first direction (the Z-axis direction). The second material portion 75b includes a material different from the first material portion 75a.

For example, the first material portion 75a includes silicon. The second material portion 75b includes, for example, at least one of silicon nitride or silicon carbide. The elastic modulus of the second material portion 75b is higher than the elastic modulus of the first material portion 75a.

For example, the first material portion 75a may include the same material as the first film 71. For example, the second material portion 75b includes a material that is different from the first film 71. By such a configuration, the first opposing film 75 can deform less easily compared to the first film 71. Thereby, the strain of the first film 71 can be controlled easily; and the sensing precision can be increased more easily.

In the sensor 120a, the second material portion 75b is provided between the first material portion 75a and the first film 71. In the embodiment, the first material portion 75a may be provided between the second material portion 75b and the first film 71.

As shown in FIG. 17B, in a sensor 121a as well, multiple stacked films are provided at the first opposing film 75. Otherwise, the sensor 121a is similar to the sensor 121. In the example as well, the first opposing film 75 includes the first material portion 75a recited above and the second material portion 75b recited above. In the sensor 121a as well, the strain of the first film 71 can be controlled easily; and the sensing precision can be increased more easily.

In the sensor 121a, the second material portion 75b is provided between the first material portion 75a and the first film 71. In the embodiment, the first material portion 75a may be provided between the second material portion 75b and the first film 71.

Figure 18:
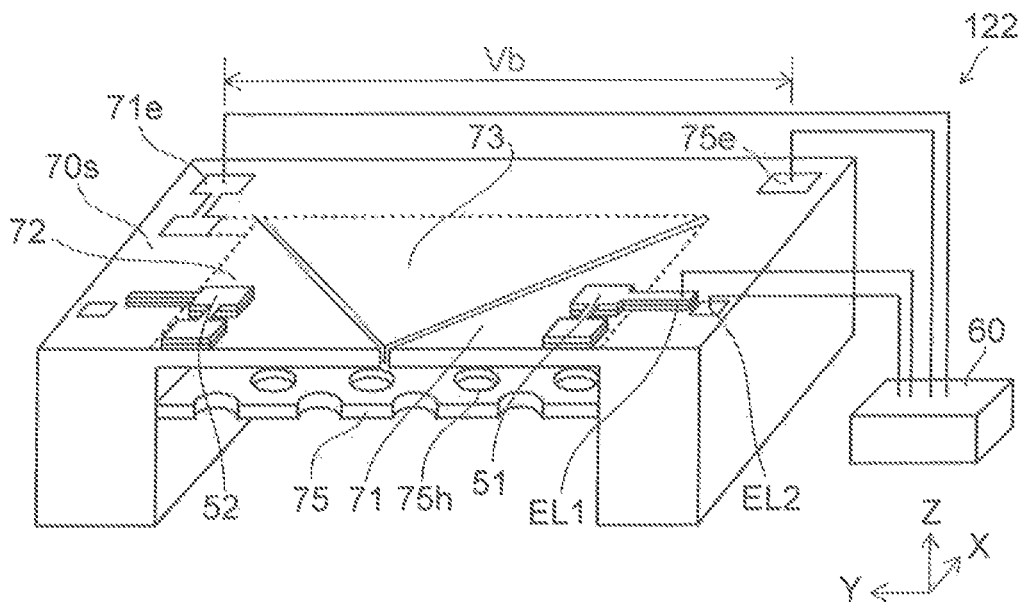
FIG. 18 is a schematic perspective view illustrating another sensor according to the second embodiment.

FIG. 18 is a schematic perspective view illustrating another sensor according to the second embodiment.

FIG. 18 illustrates the configuration of the central portion In the X-axis direction of the sensor 122 when the sensor 122 is cut by the Z-Y plane for easier viewing of the drawing.

As shown in FIG. 18, the other sensor 122 according to the embodiment includes the second film 72 and the second sensor portion 52 in addition to the first film 71, the first opposing film 75, the first sensor portion 51, the first film electrode 71e, and the first opposing film electrode 75e. Otherwise, the sensor 122 is similar to the sensor 120.

In the first direction (the Z-axis direction), the first opposing film 75 overlaps the first film 71 and overlaps the second film 72. The second film 72 is arranged with the first film 71 in a direction (in the example, the Y-axis direction) crossing the first direction (the Z-axis direction). The first film 71 and the second film 72 are "cantilever beams."

The second sensor portion 52 is provided at the second film 72. As described in reference to FIG. 10C, the second sensor portion 52 includes the third magnetic layer 13, the fourth magnetic layer 14 that is provided between the second film 72 and the third magnetic layer 13, and the second intermediate layer 12i that is provided between the third magnetic layer 13 and the fourth magnetic layer 14.

In the sensor 122 as well, the strains of the first film 71 and the second film 72 can be controlled easily; and the sensing precision can be increased more easily.

Third Embodiment

The embodiment relates to a method for manufacturing the sensor.

Figure 19:
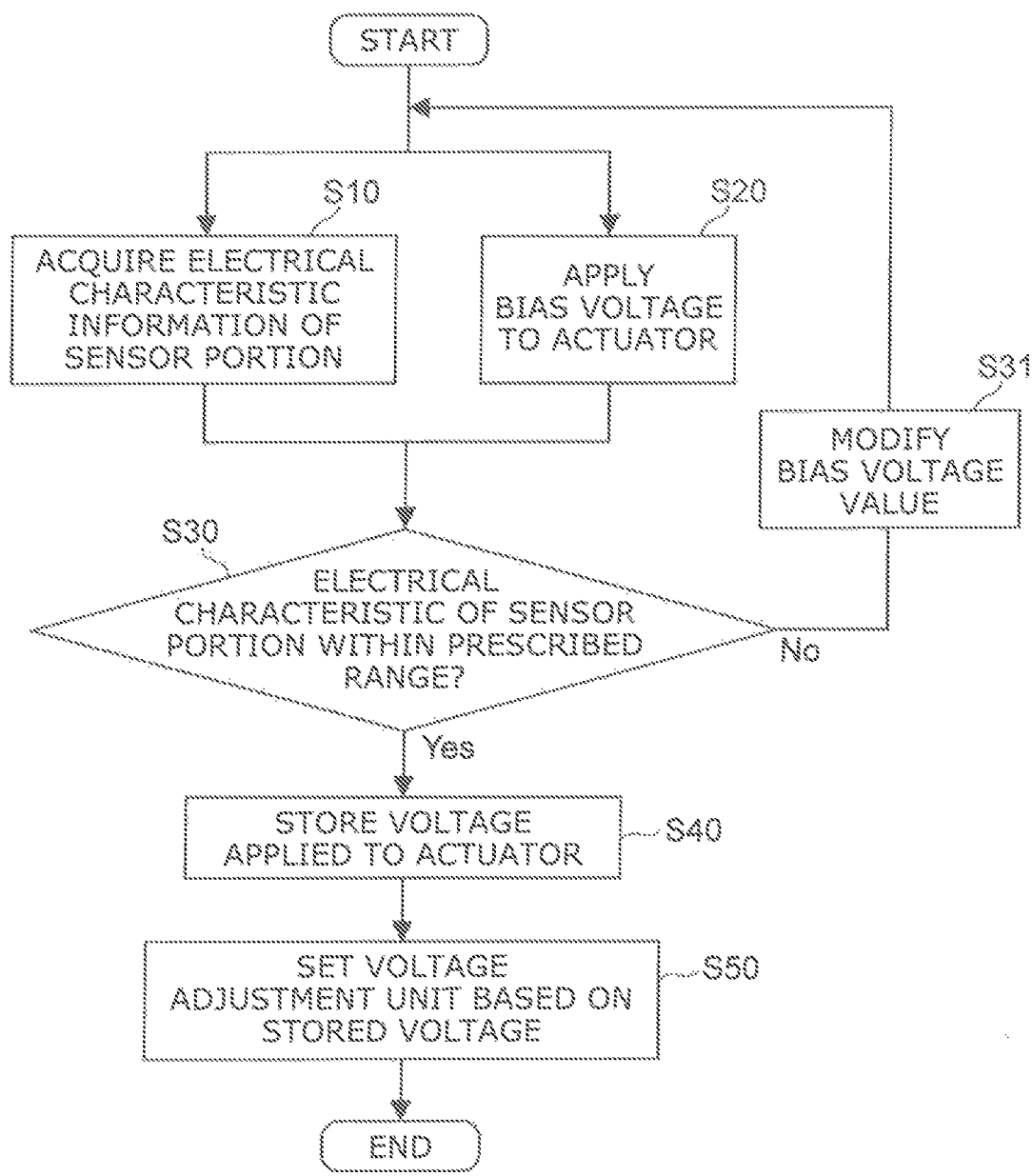
FIG. 19 is a flowchart illustrating the method for manufacturing the sensor according to the third embodiment.

FIG. 19 is a flowchart illustrating the method for manufacturing the sensor according to the third embodiment.

As shown in FIG. 19, the electrical characteristic information of the sensor portion (e.g., the first sensor portion 51) is acquired (step S10). For example, information relating to the relationship between the pressure Po and the electrical resistance Rs (referring to FIG. 3B, etc.) is acquired.

At this time, a bias voltage is applied to an actuator (step S20). The actuator is, for example, the first element portion 41 or the first opposing film 75. The bias voltage is, for example, a direct current voltage. Step S10 recited above is implemented while modifying the bias voltage.

It is determined whether or not the electrical characteristic of the sensor portion is in a prescribed range (step S30). For example, in the example of FIG. 3B, the electrical characteristic is not within the prescribed range. In the case where the electrical characteristic is not within the prescribed range, the bias voltage (the bias voltage value) is modified (step S31). Then, the flow returns to step S10 and step S20.

In the case where the electrical characteristic is in the prescribed range, the flow proceeds to step S40. The voltage that is applied to the actuator is stored in step S40.

The voltage adjustment unit is set based on the stored voltage (step S50). The voltage adjustment unit is, for example, the controller 60. Thereby, the bias voltage of the desired value is supplied to the actuator from the voltage adjustment unit. Thereby, the sensing precision can be increased; and the sensor can be manufactured.

Figure 20:
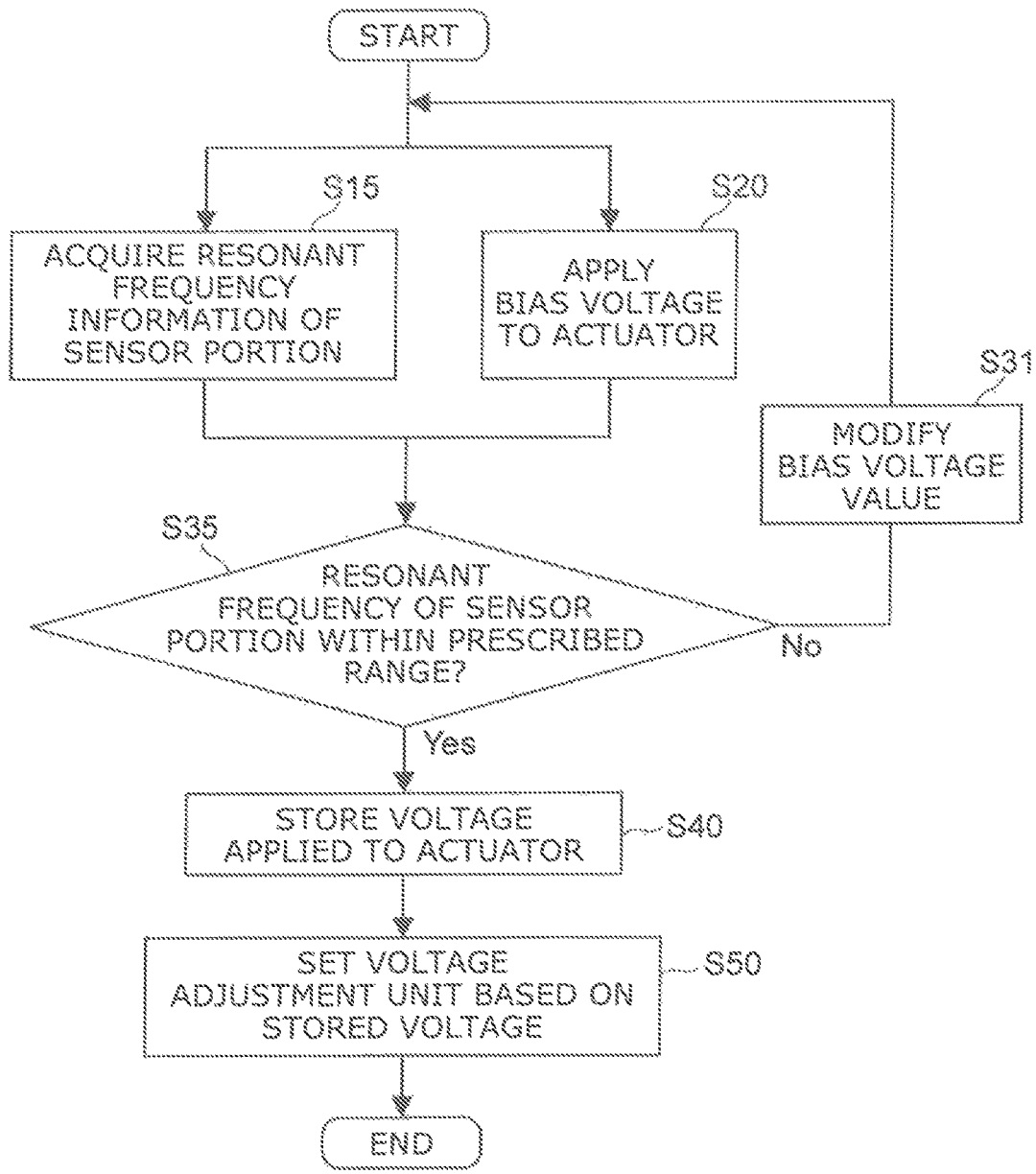
FIG. 20 is a flowchart illustrating another method for manufacturing the sensor according to the third embodiment.

FIG. 20 is a flowchart illustrating another method for manufacturing the sensor according to the third embodiment.

The resonant frequency information of the sensor portion (e.g., the first sensor portion 51) as shown in FIG. 20 is acquired (step S15).

At this time, the bias voltage is applied to the actuator (step S20). The actuator is, for example, the first element portion 41 or the first opposing film 75. The bias voltage is, for example, a direct current voltage. Step S15 recited above is implemented while modifying the bias voltage.

It is determined whether or not the resonant frequency characteristic of the sensor portion is in the prescribed range (step S35). In the case where the resonant frequency characteristic is not within the prescribed range, the bias voltage (the bias voltage value) is modified (step S31). Then, the flow returns to step S15 and step S20.

In the case where the resonant frequency characteristic is in the prescribed range, the flow proceeds to step S40. In step S40, the voltage that is applied to the actuator is stored.

The voltage adjustment unit (the controller 60) is set based on the stored voltage (step S50). Thereby, the bias voltage of the desired value is supplied to the actuator from the voltage adjustment unit. Thereby, a sensor can be manufactured in which the sensing precision can be increased.

Examples of the sensor portions included in the embodiments will now be described. In the following description, the notation "material A/material B" indicates a state in which a layer of material B is provided on a layer of material A.

Figure 21:
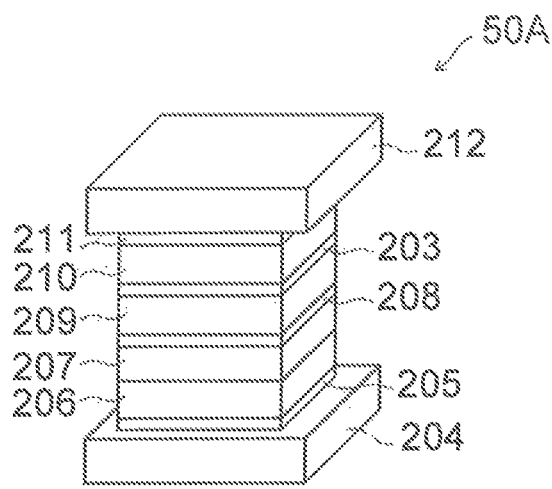
FIG. 21 is a schematic perspective view illustrating a portion of the sensor according to the embodiment.

FIG. 21 is a schematic perspective view illustrating a portion of the sensor according to the embodiment.

In a sensor portion 50A as shown in FIG. 21, a lower electrode 204, a foundation layer 205, a pinning layer 206, a second magnetization reference layer 207, a magnetic coupling layer 208, a first magnetization reference layer 209, an intermediate layer 203, a free magnetic layer 210, a capping layer 211, and an upper electrode 212 are arranged in this order. For example, the sensor portion 50A is a bottom spin-valve type. The magnetization reference layer is, for example, a fixed magnetic layer.

The foundation layer 205 includes, for example, a stacked film of tantalum and ruthenium (Ta/Ru). The thickness (the length in the Z-axis direction) of the Ta layer is, for example, 3 nanometers (nm). The thickness of the Ru layer is, for example, 2 nm. The pinning layer 206 includes, for example, an IrMn-Layer having a thickness of 7 nm. The second magnetization reference layer 207 includes, for example, a $Co_{75}Fe_{25}$ layer having a thickness of 2.5 nm. The magnetic coupling layer 208 includes, for example, a Ru layer having a thickness of 0.9 nm. The first magnetization reference layer 209 includes, for example, a $Co_{40}Fe_{40}B_{20}$ layer having a thickness of 3 nm. The intermediate layer 203 includes, for example, a MgO layer having a thickness of 1.6 nm. The free magnetic layer 210 includes, for example, $Co_{40}Fe_{40}B_{20}$ having a thickness of 4 nm. The capping layer 211 includes, for example, Ta/Ru. The thickness of the Ta layer is, for example, 1 nm. The thickness of the Ru layer is, for example, 5 nm.

The lower electrode 204 and the upper electrode 212 include, for example, at least one of aluminum (Al), an aluminum copper alloy (Al—Cu), copper (Cu), silver (Ag), or gold (Au). By using such a material having a relatively small electrical resistance as the lower electrode 204 and the upper electrode 212, the current can be caused to flow efficiently in the sensor portion 50A. The lower electrode 204 and the upper electrode 212 include nonmagnetic materials.

The lower electrode 204 and the upper electrode 212 may include, for example, a foundation layer (not illustrated) for the lower electrode 204 and the upper electrode 212, a capping layer (not illustrated) for the lower electrode 204 and the upper electrode 212, and a layer of at least one of Al. Al—Cu, Cu. Ag, or Au provided between the foundation layer and the capping layer. For example, the lower electrode 204 and the upper electrode 212 include tantalum (Ta)/copper (Cu)/tantaium (Ta), etc. For example, by using Ta as the foundation layer of the lower electrode 204 and the upper electrode 212, the adhesion between the substrate (e,g., a film) and the lower electrode 204 and between the substrate and the upper electrode 212 improves. Titanium (Ti), titanium nitride (TiN), etc., may be used as the foundation layer for the lower electrode 204 and the upper electrode 212.

By using Ta as the capping layer of the lower electrode 204 and the upper electrode 212, the oxidization of the copper (Cu), etc., under the capping layer is suppressed. Titanium (Ti), titanium nitride (TiN), etc., may be used as the capping layer for the lower electrode 204 and the upper electrode 212.

The foundation layer 205 includes, for example, a stacked structure including a buffer layer (not illustrated) and a seed layer (not illustrated). For example, the buffer layer relaxes the roughness of the surfaces of the lower electrode 204, the film, etc., and improves the crystallinity of the layers stacked on the buffer layer. For example, at least one selected from the group consisting of tantalum (Ta), titanium (Ti), vanadium (V), tungsten (W), zirconium (Zr), hafnium (Hf), and chrome (Cr) is used as the buffer layer. An alloy that includes at least one material selected from these materials may be used as the buffer layer.

It is favorable for the thickness of the buffer layer of the foundation layer 205 to be not less than 1 nm and not more than 10 nm. It is more favorable for the thickness of the buffer layer to be not less than 1 nm and not more than 5 nm. In the case where the thickness of the buffer layer is too thin, the buffering effect is lost. In the case where the thickness of the buffer layer is too thick, the thickness of the sensor portion 50A becomes excessively thick. The seed layer is formed on the buffer layer; and, for example, the seed layer has a buffering effect. In such a case, the buffer layer may be omitted. The buffer layer includes, for example, a Ta layer having a thickness of 3 nm.

The seed layer of the foundation layer 205 controls the crystal orientation of the layers stacked on the seed layer. The seed layer controls the crystal grain size of the layers stacked on the seed layer. As the seed layer, a metal having a fcc structure (face-centered cubic structure), a hcp structure (hexagonal close-packed structure), a bcc structure (body-centered cubic structure), or the like is used.

For example, the crystal orientation of the spin-valve film on the seed layer can be set to the fcc (111) orientation by using, as the seed layer of the foundation layer 205, ruthenium (Ru) having a hcp structure, NiFe having a fcc structure, or Cu having a fcc structure. The seed layer includes, for example, a Cu layer having a thickness of 2 nm or a Ru layer having a thickness of 2 nm. To increase the crystal orientation of the layers formed on the seed layer, it is favorable for the thickness of the seed layer to be not less than 1 nm and not more than 5 nm. It is more favorable for the thickness of the seed layer to be not less than 1 nm and not more than 3 nm. Thereby, the function as a seed layer that improves the crystal orientation is realized sufficiently.

On the other hand, for example, the seed layer may be omitted in the case where it is unnecessary for the layers formed on the seed layer to have a crystal orientation (e.g., in the case where an amorphous free magnetic layer is formed, etc.). For example, a Cu layer having a thickness of 2 nm is used as the seed layer.

For example, the pinning layer 206 provides unidirectional anisotropy to the second magnetization reference layer 207 (the ferromagnetic layer) formed on the pinning layer 206 and fixes the magnetization of the second magnetization reference layer 207. The pinning layer 206 includes, for example, an antiferromagnetic layer. The pinning layer 206 includes, for example, at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. An alloy may be used in which an added element is further added to the at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the pinning layer 206 is set appropriately. Thereby, for example, unidirectional anisotropy of sufficient strength is provided.

For example, heat treatment is performed while applying a magnetic field. Thereby, for example, the magnetization of the ferromagnetic layer contacting the pinning layer 206 is fixed. The magnetization of the ferromagnetic layer contacting the pinning layer 206 is fixed in the direction of the magnetic field applied in the heat treatment. For example, the heat treatment temperature (the annealing temperature) is not less than the magnetization pinning temperature of the antiferromagnetic material included in the pinning layer 206. In the case where an antiferromagnetic layer including Mn is used, there are cases where the MR ratio decreases due to the Mn diffusing into layers other than the pinning layer 206. It is desirable for the heat treatment temperature to be set to be not more than the temperature at which the diffusion of Mn occurs. The heat treatment temperature is, for example, not less than 200° C. and not more than 500° C. Favorably, the heat treatment temperature is, for example, not less than 250° C. and not more than 400° C.

In the case where PtMn or PdPtMn is used as the pinning layer 206, it is favorable for the thickness of the pinning layer 206 to be not less than 8 nm and not more than 20 nm. It is more favorable for the thickness of the pinning layer 206 to be not less than 10 nm and not more than 15 nm. In the case where IrMn is used as the pinning layer 206, unidirectional anisotropy can be provided using a thickness that is thinner than the case where PtMn is used as the pinning layer 206. In such a case, it is favorable for the thickness of the pinning layer 206 to be not less than 4 nm and not more than 18 nm. It is more favorable for the thickness of the pinning layer 206 to be not less than 5 nm and not more than 15 nm. The pinning layer 206 includes, for example, an $Ir_{22}Mn_{78}$ layer having a thickness of 7 nm.

A hard magnetic layer may be used as the pinning layer 206. For example, Co—Pt, Fe—Pt, Co—Pd, Fe—Pd, etc., may be used as the hard magnetic layer. For example, the magnetic anisotropy and the coercivity are relatively high for these materials. These materials are hard magnetic materials. An alloy in which an added element is further added to Co—Pt, Fe—Pt, Co—Pd, or Fe—Pd may be used as the pinning layer 206. For example, CoPt (the proportion of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %). FePt (the proportion of Pt being not less than 40 at. % and not more than 60 at. %), etc., may be used.

The second magnetization reference layer 207 includes, for example, a $Co_xFe_{100-x}$ alloy (x being not less than 0 at. % and not more than 100 at. %) or a $Ni_xFe_{100-x}$ alloy (x being not less than 0 at. % and not more than 100 at. %). These materials may include a material to which a nonmagnetic element is added. For example, at least one selected from the group consisting of Co, Fe, and Ni is used as the second magnetization reference layer 207. An alloy that includes at least one material selected from these materials may be used as the second magnetization reference layer 207. Also, a $(Co_xFe_{100-x})_{100-y}B_y$ alloy (x being not less than 0 at. % and not more than 100 at. %, and y being not less than 0 at. % and not more than 30 at. %) may be used as the second magnetization reference layer 207. By using an amorphous alloy of $(Co_xFe_{100-x})_{100-y}B_y$ as the second magnetization reference layer 207, the fluctuation of the characteristics of the sensor portion 50A can be suppressed even in the case where the sizes of the sensor portions are small.

For example, it is favorable for the thickness of the second magnetization reference layer 207 to be not less than 1.5 nm and not more than 5 nm. Thereby, for example, the strength of the unidirectional anisotropic magnetic field due to the pinning layer 206 can be stronger. For example, the strength of the antiferromagnetic coupling magnetic field between the second magnetization reference layer 207 and the first magnetization reference layer 209 via the magnetic coupling layer formed on the second magnetization reference layer 207 can be stronger. For example, it is favorable for the magnetic thickness (the product of the saturation magnetization and the thickness) of the second magnetization reference layer 207 to be substantially equal to the magnetic thickness of the first magnetization reference layer 209.

The saturation magnetization of the thin film of $Co_{40}Fe_{40}B_{20}$ is about 1.9 T (teslas). For example, in the case where a $Co_{40}Fe_{40}B_{20}$ layer having a thickness of 3 nm is used as the first magnetization reference layer 209, the magnetic thickness of the first magnetization reference layer 209 is 1.9 T×3 nm, i.e., 5.7 Tnm. On the other hand, the saturation magnetization of $Co_{75}Fe_{25}$ is about 2.1 T. The thickness of the second magnetization reference layer 207 to obtain a magnetic thickness equal to that recited above is 5.7 Tnm/2.1 T, i.e., 2.7 nm. In such a case, it is favorable for a $Co_{75}Fe_{25}$ layer having a thickness of about 2.7 nm to be included in the second magnetization reference layer 207. For example, a $Co_{75}Fe_{25}$ layer having a thickness of 2.5 nm is used as the second magnetization reference layer 207.

In the sensor portion 50A, a synthetic pinned structure made of the second magnetization reference layer 207, the magnetic coupling layer 208, and the first magnetization reference layer 209 is used. A single pinned structure made of one magnetization reference layer may be used instead. In the case where the single pinned structure is used, for example, a $Co_{40}Fe_{40}B_{20}$ layer having a thickness of 3 nm is used as the magnetization reference layer. The same material as the second magnetization reference layer 207 described above may be used as the ferromagnetic layer included in the magnetization reference layer having the single pinned structure.

The magnetic coupling layer 208 causes antiferromagnetic coupling to occur between the second magnetization reference layer 207 and the first magnetization reference layer 209. The magnetic coupling layer 208 has a synthetic pinned structure. For example, Ru is used as the material of the magnetic coupling layer 208. For example, it is favorable for the thickness of the magnetic coupling layer 208 to be not less than 0.8 nm and not more than 1 nm. A material other than Ru may be used as the magnetic coupling layer 208 if the material causes sufficient antiferromagnetic coupling to occur between the second magnetization reference layer 207 and the first magnetization reference layer 209. For example, the thickness of the magnetic coupling layer 208 is set to be a thickness not less than 0.8 nm and not more than 1 nm corresponding to the second peak (2nd peak) of RKKY (Ruderman-Kittel-Kasuya-Yosida) coupling. Further, the thickness of the magnetic coupling layer 208 may be set to be a thickness not less than 0.3 nm and not more than 0.6 nm corresponding to the first peak (1st peak) of RKKY coupling. For example, Ru having a thickness of 0.9 nm is used as the material of the magnetic coupling layer 208. Thereby, highly reliable coupling is obtained more stably.

The magnetic layer that is included in the first magnetization reference layer 209 contributes directly to the MR effect. For example, a Co—Fe—B alloy is used as the first magnetization reference layer 209. Specifically, a $(Co_xFe_{100-x})_{100-y}B_y$ alloy (x being not less than 0 at. % and not more than 100 at. %, and y being not less than 0 at. % and not more than 30 at. %) may be used as the first magnetization reference layer 209. For example, the fluctuation between the elements caused by crystal grains can be suppressed even in the case where the size of the sensor portion 50A is small by using a $(Co_xFe_{100-x})_{100-y}B_y$ amorphous alloy as the first magnetization reference layer 209.

The layer (e.g., a tunneling insulating layer (not illustrated)) that is formed on the first magnetization reference layer 209 may be planarized. The defect density of the tunneling insulating layer can be reduced by planarizing the tunneling insulating layer. Thereby, a higher MR ratio is obtained with a lower resistance per area. For example, in the case where MgO is used as the material of the tunneling insulating layer, the (100) orientation of the MgO layer that is formed on the tunneling insulating layer can be strengthened by using a $(Co_xFe_{100-x})_{100-y}B_y$ amorphous alloy as the first magnetization reference layer 209. A higher MR ratio is obtained by increasing the (100) orientation of the MgO layer. The $(Co_xFe_{100-x})_{100-y}B_y$ alloy crystallizes using the (100) plane of the MgO layer as a template when annealing. Therefore, good crystal conformation between the MgO and the $(Co_xFe_{100-x})_{100-y}B_y$ alloy is obtained. A higher MR ratio is obtained by obtaining good crystal conformation.

Other than the Co—Fe—B alloy, for example, an FeCo alloy may be used as the first magnetization reference layer 209.

A higher MR ratio is obtained as the thickness of the first magnetization reference layer 209 increases. For example, a larger fixed magnetic field is obtained as the thickness of the first magnetization reference layer 209 decreases. A trade-off relationship between the MR ratio and the fixed magnetic field exists for the thickness of the first magnetization reference layer 209. In the case where the Co—Fe—B alloy is used as the first magnetization reference layer 209, it is favorable for the thickness of the first magnetization reference layer 209 to be not less than 1.5 nm and not more than 5 nm. It is more favorable for the thickness of the first magnetization reference layer 209 to be not less than 2.0 nm and not more than 4 nm.

Other than the materials described above, the first magnetization reference layer 209 may include a $Co_{90}Fe_{10}$ alloy having a fcc structure, Co having a hcp structure, or a Co alloy having a hcp structure. For example, at least one selected from the group consisting of Co, Fe, and Ni is used as the first magnetization reference layer 209. An alloy that includes at least one material selected from these materials may be used as the first magnetization reference layer 209. For example, a higher MR ratio is obtained by using an FeCo alloy material having a bcc structure, a Co alloy having a cobalt composition of 50% or more, or a material (a Ni alloy) having a Ni composition of 50% or more as the first magnetization reference layer 209.

For example, a Heusler magnetic alloy layer such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, $Co_2FeGa_{0.5}Ge_{0.5}$, etc., also may be used as the first magnetization reference layer 209. For example, a $Co_{40}Fe_{40}B_{20}$ layer having a thickness of 3 nm may be used as the first magnetization reference layer 209.

For example, the intermediate layer 203 breaks the magnetic coupling between the first magnetization reference layer 209 and the free magnetic layer 210.

For example, the material of the intermediate layer 203 includes a metal, an insulator, or a semiconductor. For example, Cu, Au, Ag, or the like is used as the metal. In the case where a metal is used as the intermediate layer 203, the thickness of the intermediate layer is, for example, not less than about 1 nm and not more than about 7 nm. For example, magnesium oxide (MgO, etc.), aluminum oxide ($Al_2O_3$, etc.), titanium oxide (TiO, etc.), zinc oxide (ZnO, etc.), gallium oxide (Ga—O), or the like is used as the insulator or the semiconductor. In the case where the insulator or the semiconductor is used as the intermediate layer 203, the thickness of the intermediate layer 203 is, for example, not less than about 0.6 nm and not more than about 2.5 nm. For example, a CCP (Current-Confined-Path) spacer layer may be used as the intermediate layer 203. In the case where a CCP spacer layer is used as the spacer layer, for example, a structure is used in which a copper (Cu) metal path is formed inside an insulating layer of aluminum oxide ($Al_2O_3$). For example, a MgO layer having a thickness of 1.6 nm is used as the intermediate layer.

The free magnetic layer 210 includes a ferromagnet material. For example, the free magnetic layer 210 includes a ferromagnet material including Fe, Co, and Ni. For example, an FeCo alloy, a NiFe alloy, or the like is used as the material of the free magnetic layer 210. The free magnetic layer 210 may include a Co—Fe—B alloy, an Fe—Co—Si—B alloy, an Fe—Ga alloy having a large λs (magnetostriction constant), an Fe—Co—Ga alloy, a Tb-M-Fe alloy, a Tb-M1-Fe-M2 alloy, an Fe-M3-M4-B alloy, Ni, Fe—Al, ferrite, etc. For example, the λs (the magnetostriction constant) is large for these materials. In the Tb-M-Fe alloy recited above, M1 is at least one selected from the group consisting of Sm, Eu, Gd, Dy, Ho, and Er. In the Tb-M1-Fe-M2 alloy recited above, M1 is at least one selected from the group consisting of Sm, Eu, Gd, Dy, Ho, and Er. M2 is at least one selected from the group consisting of Ti, Cr, Mr, Co, Cu, Nb, Mo, W, and Ta. In the Fe-M3-M4-B alloy recited above, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. $Fe_3O_4$, $(FeCo)_3O_4$, etc., are examples of the ferrite recited above. The thickness of the free magnetic layer 210 is, for example, 2 nm or more.

The free magnetic layer 210 may include a magnetic material including boron. The free magnetic layer 210 may include, for example, an alloy including boron (B) and at least one element selected from the group consisting of Fe, Co, and Ni. The free magnetic layer 210 includes, for example, a Co—Fe—B alloy or an Fe—B alloy. For example, a $Co_{40}Fe_{40}B_{20}$ alloy is used. Ga, Al, Si, W, etc., may be added in the case where the free magnetic layer 210 includes an alloy including boron (B) and at least one element selected from the group consisting of Fe, Co, and Ni. For example, high magnetostriction is promoted by adding these elements. For example, an Fe—Ga—B alloy, an Fe—Co—Ga—B alloy, or an Fe—Co—Si—B alloy may be used as the free magnetic layer 210. By using such a magnetic material containing boron, the coercivity (Hc) of the free magnetic layer 210 is low; and the change of the magnetization direction for the strain is easy. Thereby, high sensitivity is obtained.

It is favorable for the boron concentration (e.g., the composition ratio of boron) of the free magnetic layer 210 to be 5 at. % (atomic percent) or more. Thereby, an amorphous structure is obtained easily. It is favorable for the boron concentration of the free magnetic layer to be 35 at. % or less. For example, the magnetostriction constant decreases when the boron concentration is too high. For example, it is favorable for the boron concentration of the free magnetic layer to be not less than 5 at. % and not more than 35 at. %; and it is more favorable to be not less than 10 at. % and not more than 30 at. %.

In the case where a portion of the magnetic layer of the free magnetic layer 210 includes $Fe_{1-y}B_y$ (0<y≤0.3) or $(Fe_zX_{1-z})_{1-y}B_y$ (X being Co or Ni, 0.8≤z<1, and 0<y≤0.3), it is easy to realize both a large magnetostriction constant λ and a low coercivity. Therefore, this is particularly favorable from the perspective of obtaining a high gauge factor. For example, Fe$_{80}$B$_{20}$ (4 nm) is used as the free magnetic layer 210. Co$_{40}$Fe$_{40}$B$_{20}$ (0.5 nm)/Fe$_{80}$B$_{20}$ (4 nm) may be used as the free magnetic layer.

The free magnetic layer 210 may have a multilayered structure. In the case where a tunneling insulating layer of MgO is used as the intermediate layer 203, it is favorable to provide a layer of a Co—Fe—B alloy at the portion of the free magnetic layer 210 contacting the intermediate layer 203. Thereby, a high magnetoresistance effect is obtained. In such a case, a layer of a Co—Fe—B alloy is provided on the intermediate layer 203; and another magnetic material that has a large magnetostriction constant is provided on the layer of the Co—Fe—B alloy. In the case where the free magnetic layer 210 has the multilayered structure, for example, the free magnetic layer 210 may include Co—Fe—B (2 nm)/Fe—Co—Si—B (4 nm), etc.

The capping layer 211 protects the layers provided under the capping layer 211. The capping layer 211 includes, for example, multiple metal layers. The capping layer 211 Includes, for example, a two-layer structure (Ta/Ru) of a Ta layer and a Ru layer. The thickness of the Ta layer is, for example, 1 nm; and the thickness of the Ru layer is, for example, 5 nm. As the capping layer 211, another metal layer may be provided instead of the Ta layer and/or the Ru layer. The configuration of the capping layer 211 is arbitrary. For example, a nonmagnetic material is used as the capping layer 211. Another material may be used as the capping layer 211 as long as the material can protect the layers provided under the capping layer 211.

In the case where the free magnetic layer 210 includes a magnetic material containing boron, a diffusion suppression layer (not illustrated) of an oxide material and/or a nitride material may be provided between the free magnetic layer 210 and the capping layer 211. Thereby, for example, the diffusion of boron is suppressed. By using the diffusion suppression layer including an oxide layer or a nitride layer, the diffusion of the boron included in the free magnetic layer 210 can be suppressed; and the amorphous structure of the free magnetic layer 210 can be maintained. As the oxide material and/or the nitride material included in the diffusion suppression layer, for example, an oxide material or a nitride material including an element such as Mg, Al, Si, Ti, V, Cr, Mn, Fe, Co, Ni, Cu, Zn, Zr, Nb, Mo, Ru, Rh, Pd, Ag, Hf, Ta, W, Sn, Cd, Ga, or the like is used. The diffusion suppression layer is a layer that does not contribute to the magnetoresistance effect. It is favorable for the resistance per area of the diffusion suppression layer to be low. For example, it is favorable for the resistance per area of the diffusion suppression layer to be set to be lower than the resistance per area of the intermediate layer that contributes to the magnetoresistance effect. From the perspective of reducing the resistance per area of the diffusion suppression layer, it is favorable for the diffusion suppression layer to be an oxide or a nitride of Mg, Ti, V, Zn, Sn, Cd, or Ga. The barrier height these materials is low. It is favorable to use an oxide having a strong chemical bond to suppress the diffusion of the boron. For example, a MgO layer of 1.5 nm is used. Oxynitrides are included in one of the oxide or the nitride.

In the case where the diffusion suppression layer includes an oxide or a nitride, it is favorable for the thickness of the diffusion suppression layer to be, for example, 0.5 nm or more. Thereby, the diffusion suppression function of the boron is realized sufficiently. It is favorable for the thickness of the diffusion suppression layer to be 5 nm or less. Thereby, for example, a low resistance per area is obtained. It is favorable for the thickness of the diffusion suppression layer to be not less than 0.5 nm and not more than 5 nm; and it is favorable to be not less than 1 nm and not more than 3 nm.

At least one selected from the group consisting of magnesium (Mg), silicon (Si), and aluminum (Al) may be used as the diffusion suppression layer. A material that includes these light elements may be used as the diffusion suppression layer. These light elements produce compounds by bonding with boron. For example, at least one of a Mg—B compound, an Al—B compound, or a Si—B compound is formed at the portion including the interface between the diffusion suppression layer and the free magnetic layer 210. These compounds suppress the diffusion of boron.

Another metal layer, etc., may be inserted between the diffusion suppression layer and the free magnetic layer 210. In the case where the distance between the diffusion suppression layer and the free magnetic layer 210 is too long, boron diffuses between the diffusion suppression layer and the free magnetic layer 210; and the boron concentration in the free magnetic layer 210 undesirably decreases. Therefore, it is favorable for the distance between the diffusion suppression layer and the free magnetic layer 210 to be 10 nm or less; and it is more favorable to be 3 nm or less.

Figure 22:
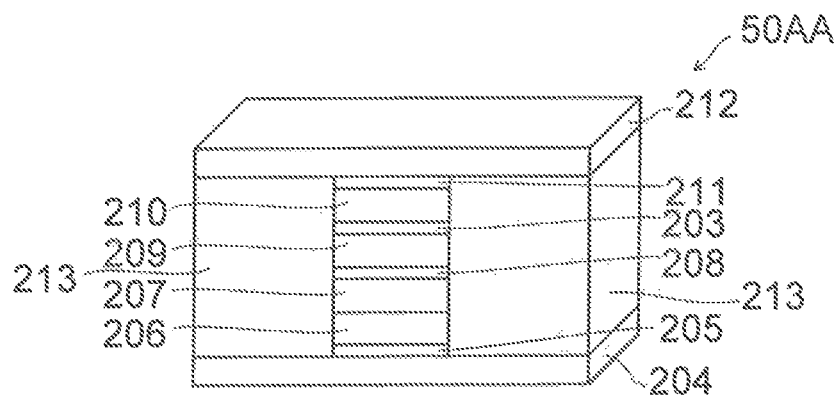
FIG. 22 is a schematic perspective view illustrating a portion of another sensor according to the embodiment.

FIG. 22 is a schematic perspective view illustrating a portion of another sensor according to the embodiment.

As shown in FIG. 22, other than an insulating layer 213 being provided, a sensor portion 50AA is similar to the sensor portion 50A. The insulating layer 213 is provided between the lower electrode 204 and the upper electrode 212. The insulating layer 213 is arranged with the free magnetic layer 210 and the first magnetization reference layer 209 in a direction crossing the direction connecting the lower electrode 204 and the upper electrode 212. Portions other than the insulating layer 213 are similar to those of the sensor portion 50A; and a description is therefore omitted.

The insulating layer 213 includes, for example, aluminum oxide (e.g., Al$_2$O$_3$), silicon oxide (e.g., SiO$_2$), etc. The leakage current of the sensor portion 50AA is suppressed by the insulating layer 213. The insulating layer 213 may be provided in the sensor portions described below.

Figure 23:
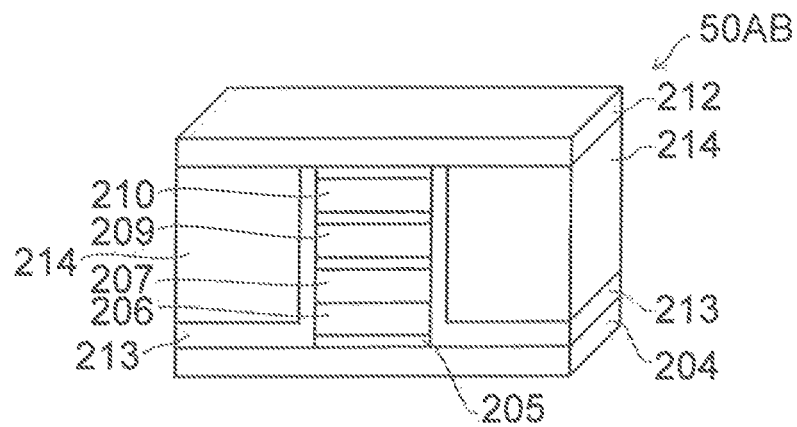
FIG. 23 is a schematic perspective view illustrating a portion of another sensor according to the embodiment.

FIG. 23 is a schematic perspective view illustrating a portion of another sensor according to the embodiment.

As shown in FIG. 23, a hard bias layer 214 is further provided in a sensor portion 50AB. Otherwise, the sensor portion 50AB is similar to the sensor portion 50A. The hard bias layer 214 is provided between the lower electrode 204 and the upper electrode 212. The free magnetic layer 210 and the first magnetization reference layer 209 are provided between two portions of the hard bias layer 214 in a direction crossing the direction connecting the lower electrode 204 and the upper electrode 212. Otherwise, the sensor portion 50AB is similar to the sensor portion 50AA.

The hard bias layer 214 sets the magnetization direction of the free magnetic layer 210 by the magnetization of the hard bias layer 214. The magnetization direction of the free magnetic layer 210 is set to the desired direction by the hard bias layer 214 in a state in which pressure from the outside is not applied to the film.

The hard bias layer 214 includes, for example, Co—Pt, Fe—Pt, Co—Pd, Fe—Pd, etc. For example, the magnetic anisotropy and the coercivity are relatively high for these materials. These materials are, for example, hard magnetic materials. The hard bias layer 214 may include, for example, an alloy in which an added element is further added to Co—Pt, Fe—Pt, Co—Pd, or Fe—Pd. The hard bias layer 214 may include, for example, CoPt (the proportion of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %). FePt (the proportion of Pt being not less than 40 at. % and not more than 60 at. %), etc. In the case where such a material is used, by applying an external magnetic field that is larger than the coercivity of the hard bias layer 214, the direction of the magnetization of the hard bias layer 214 is set (fixed) in the direction in which the external magnetic field is applied. The thickness of the hard bias layer 214 (e.g., the length along the direction from the lower electrode 204 toward the upper electrode) is, for example, not less than 5 nm and not more than 50 nm.

In the case where the insulating layer 213 is provided between the lower electrode 204 and the upper electrode 212, $SiO_x$ or $AlO_x$ is used as the material of the insulating layer 213. A not-illustrated foundation layer may be further provided between the insulating layer 213 and the hard bias layer 214. Cr, Fe—Co, or the like is used as the material of the foundation layer for the hard bias layer 214 in the case where the hard bias layer 214 includes a hard magnetic material such as Co—Pt, Fe—Pt, Co—Pd, Fe—Pd, etc.

The hard bias layer 214 may have a structure of being stacked with a not-Illustrated pinning layer for the hard bias layer. In such a case, the direction of the magnetization of the hard bias layer 214 can be set (fixed) by the exchange coupling of the hard bias layer 214 and the pinning layer for the hard bias layer. In such a case, the hard bias layer 214 includes a ferromagnetic material of at least one of Fe, Co, or Ni or an alloy including at least one type of these elements. In such a case, the hard bias layer 214 includes, for example, a $Co_xFe_{100-x}$ alloy (x being not less than 0 at. % and not more than 100 at. %), a $Ni_xFe_{100-x}$ alloy (x being not less than 0 at. % and not more than 100 at. %), or a material in which a nonmagnetic element is added to these alloys. A material that is similar to the first magnetization reference layer 209 recited above is used as the hard bias layer 214. The pinning layer for the hard bias layer includes a material similar to the pinning layer 206 inside the sensor portion 50A recited above. In the case where the pinning layer for the hard bias layer is provided, a foundation layer similar to the material included in the foundation layer 205 may be provided under the pinning layer for the hard bias layer. The pinning layer for the hard bias layer may be provided at a lower portion or at an upper portion of the hard bias layer. In such a case, the magnetization direction of the hard bias layer 214 is determined by heat treatment in a magnetic field similarly to the pinning layer 206.

The hard bias layer 214 and the insulating layer 213 recited above are applicable to any sensor portion according to the embodiment. By using the stacked structure of the hard bias layer 214 and the pinning layer for the hard bias layer, the orientation of the magnetization of the hard bias layer 214 can be maintained easily even when a large external magnetic field is applied to the hard bias layer 214 for a short period of time.

Figure 24:
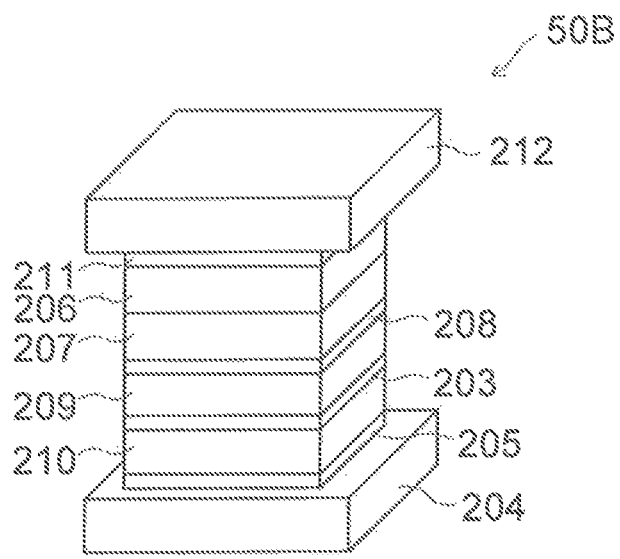
FIG. 24 is a schematic perspective view illustrating a portion of another sensor according to the embodiment.

FIG. 24 is a schematic perspective view illustrating a portion of another sensor according to the embodiment.

In a sensor portion 50B as shown in FIG. 24, the lower electrode 204, the foundation layer 205, the free magnetic layer 210, the intermediate layer 203, the first magnetization reference layer 209, the magnetic coupling layer 208, the second magnetization reference layer 207, the pinning layer 206, the capping layer 211, and the upper electrode 212 are stacked in order. The sensor portion 50B is, for example, a top spin-valve type.

The foundation layer 205 includes, for example, a stacked film of tantalum and copper (Ta/Cu). The thickness (the length in the Z-axis direction) of the Ta layer is, for example, 3 nm. The thickness of the Cu layer is, for example, 5 nm. The free magnetic layer 210 includes, for example, $Co_{40}Fe_{40}B_{20}$ having a thickness of 4 nm. The intermediate layer 203 includes, for example, a MgO layer having a thickness of 1.6 nm. The first magnetization reference layer 209 includes, for example, $Co_{40}Fe_{40}B_{20}/Fe_{50}Co_{50}$. The thickness of the $Co_{40}Fe_{40}B_{20}$ layer is, for example, 2 nm. The thickness of the $Fe_{50}Co_{50}$ layer is, for example, 1 nm. The magnetic coupling layer 208 includes, for example, a Ru layer having a thickness of 0.9 nm. The second magnetization reference layer 207 includes, for example, a $Co_{75}Fe_{25}$ layer having a thickness of 2.5 nm. The pinning layer 206 includes, for example, an IrMn-layer having a thickness of 7 nm. The capping layer 211 includes, for example, Ta/Ru. The thickness of the Ta layer is, for example, 1 nm. The thickness of the Ru layer is, for example, 5 nm.

The materials of the layers included in the sensor portion 50B may be the vertically-inverted materials of the layers included in the sensor portion 50A. The diffusion suppression layer recited above may be provided between the foundation layer 205 and the free magnetic layer 210 of the sensor portion 50B.

Figure 25:
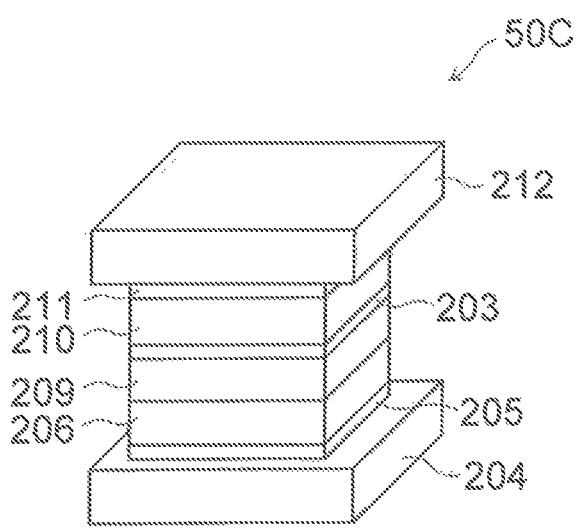
FIG. 25 is a schematic perspective view illustrating a portion of another sensor according to the embodiment.

FIG. 25 is a schematic perspective view illustrating a portion of another sensor according to the embodiment.

In a sensor portion 50C as shown in FIG. 25, the lower electrode 204, the foundation layer 205, the pinning layer 206, the first magnetization reference layer 209, the intermediate layer 203, the free magnetic layer 210, and the capping layer 211 are stacked in this order. For example, the sensor portion 50C has a single pinned structure that uses a single magnetization reference layer.

The foundation layer 205 includes, for example, Ta/Ru. The thickness (the length in the Z-axis direction) of the Ta layer is, for example, 3 nm. The thickness of the Ru layer is, for example, 2 nm. The pinning layer 206 includes, for example, an IrMn-layer having a thickness of 7 nm. The first magnetization reference layer 209 includes, for example, a $Co_{40}Fe_{40}B_{20}$ layer having a thickness of 3 nm. The intermediate layer 203 includes, for example, a MgO layer having a thickness of 1.6 nm. The free magnetic layer 210 includes, for example, $Co_{40}Fe_{40}B_{20}$ having a thickness of 4 nm. The capping layer 211 includes, for example, Ta/Ru. The thickness of the Ta layer is, for example, 1 nm. The thickness of the Ru layer is, for example, 5 nm.

For example, materials similar to the materials of the layers of the sensor portion 50A are used as the materials of the layers of the sensor portion 50C.

Figure 26:
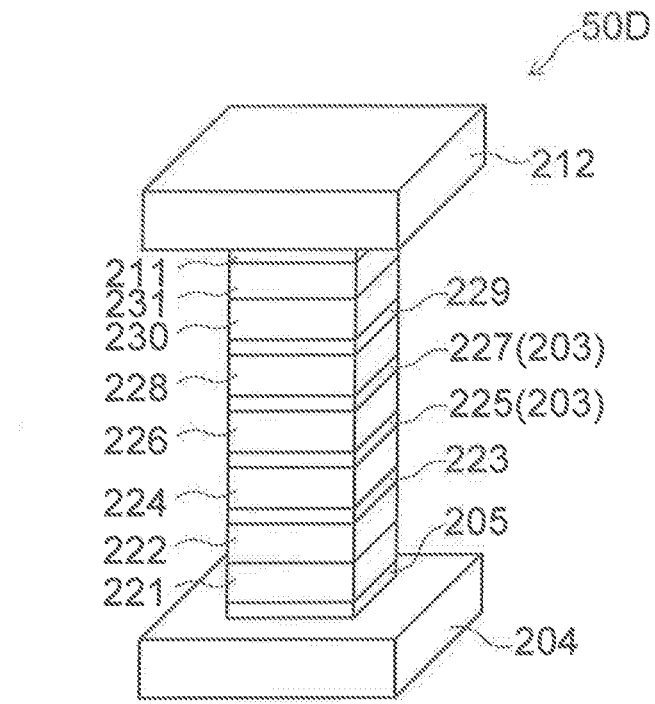
FIG. 26 is a schematic perspective view illustrating a portion of another sensor according to the embodiment.

FIG. 26 is a schematic perspective view illustrating a portion of another sensor according to the embodiment.

In a sensor portion 50D as shown in FIG. 26, the lower electrode 204, the foundation layer 205, a lower pinning layer 221, a lower second magnetization reference layer 222, a lower magnetic coupling layer 223, a lower first magnetization reference layer 224, a lower intermediate layer 225, a free magnetic layer 226, an upper intermediate layer 227, an upper first magnetization reference layer 228, an upper magnetic coupling layer 229, an upper second magnetization reference layer 230, an upper pinning layer 231, and the capping layer 211 are stacked in order.

The foundation layer 205 includes, for example, Ta/Ru. The thickness (the length in the Z-axis direction) of the Ta layer is, for example, 3 nanometers (nm). The thickness of the Ru layer is, for example, 2 nm. The lower pinning layer 221 includes, for example, an IrMn-layer having a thickness of 7 nm. The lower second magnetization reference layer 222 includes, for example, a $Co_{75}Fe_{25}$ layer having a thickness of 2.5 nm. The lower magnetic coupling layer 223 includes, for example, a Ru layer having a thickness of 0.9 nm. The lower first magnetization reference layer 224 includes, for example, a $Co_{40}Fe_{40}B_{20}$ layer having a thickness of 3 nm. The lower intermediate layer 225 includes, for example, a MgO layer having a thickness of 1.6 nm. The free magnetic layer 226 includes, for example, $Co_{40}Fe_{40}B_{20}$ having a thickness of 4 nm. The upper intermediate layer 227 includes, for example, a MgO layer having a thickness of 1.6 nm. The upper first magnetization reference layer 228 includes, for example, $Co_{40}Fe_{40}B_{20}/Fe_{50}Co_{50}$. The thickness of the $Co_{40}Fe_{40}B_{20}$ layer is, for example, 2 nm. The thickness of the $Fe_{50}Co_{50}$ layer is, for example, 1 nm. The upper magnetic coupling layer 229 includes, for example, a Ru layer having a thickness of 0.9 nm. The upper second magnetization reference layer 230 includes, for example, a $Co_{75}Fe_{25}$ layer having a thickness of 2.5 nm. The upper pinning layer 231 includes, for example, an IrMn-layer having a thickness of 7 nm. The capping layer 211 includes, for example, Ta/Ru. The thickness of the Ta layer is, for example, 1 nm. The thickness of the Ru layer is, for example, 5 nm.

For example, materials similar to the materials of the layers of the sensor portion 50A are used as the materials of the layers of the sensor portion 50D.

Figure 27:
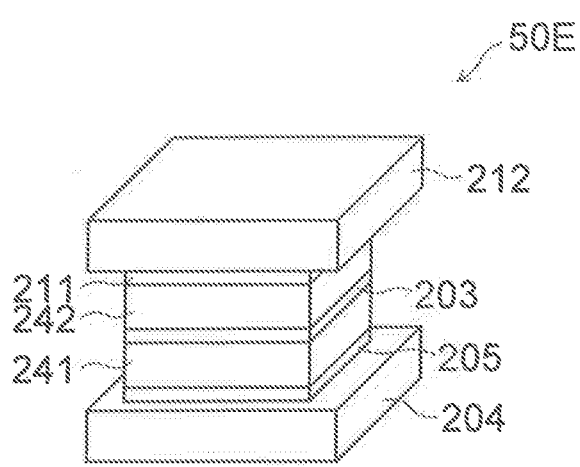
FIG. 27 is a schematic perspective view illustrating a portion of another sensor according to the embodiment.

FIG. 27 is a schematic perspective view illustrating a portion of another sensor according to the embodiment.

In a sensor portion 50E as shown in FIG. 27, the lower electrode 204, the foundation layer 205, a first free magnetic layer 241, the intermediate layer 203, a second free magnetic layer 242, the capping layer 211, and the upper electrode 212 are stacked in this order.

The foundation layer 205 includes, for example, Ta/Cu. The thickness (the length in the Z-axis direction) of the Ta layer is, for example, 3 nm. The thickness of the Cu layer is, for example, 5 nm. The first free magnetic layer 241 includes, for example, $Co_{40}Fe_{40}B_{20}$ having a thickness of 4 nm. The intermediate layer 203 includes, for example, $Co_{40}Fe_{40}B_{20}$ having a thickness of 4 nm. The capping layer 211 includes, for example, Cu/Ta/Ru. The thickness of the Cu layer is, for example, 5 nm. The thickness of the Ta layer is, for example, 1 nm. The thickness of the Ru layer is, for example, 5 nm.

Materials similar to the materials of the layers of the sensor portion 50A are used as the materials of the layers of the sensor portion 50E. For example, materials similar to those of the free magnetic layer 210 of the sensor portion 50A may be used as the materials of the first free magnetic layer 241 and the second free magnetic layer 242.

Fourth Embodiment

Figure 28A:
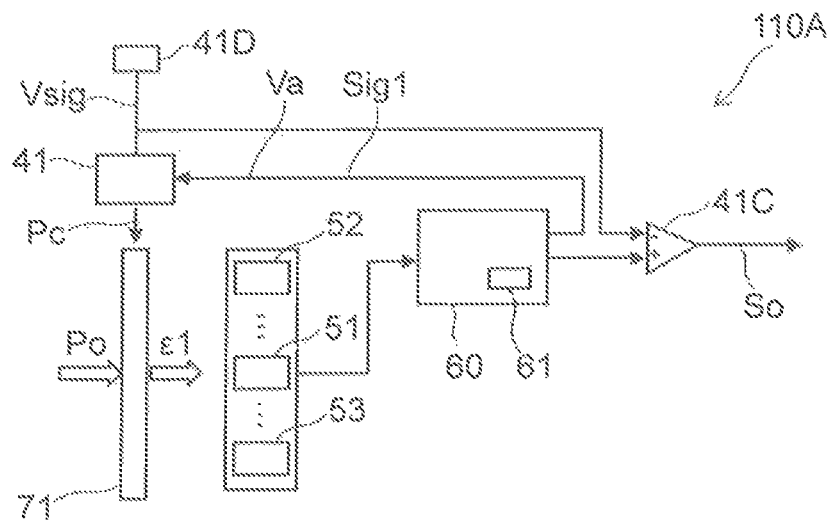
FIG. 28A to FIG. 28C ere schematic views illustrating a sensor according to a fourth embodiment.
Figure 28B:
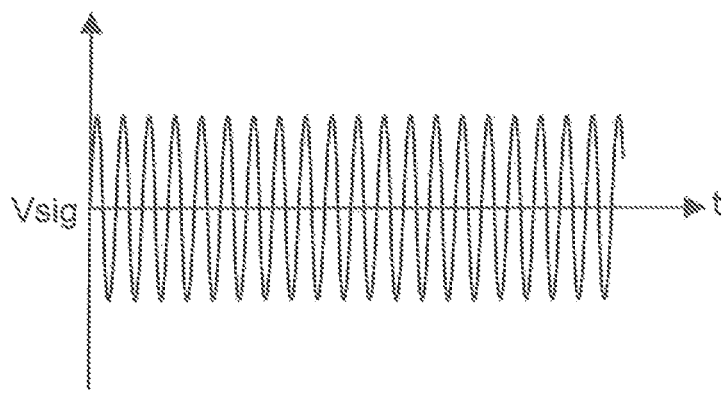
Figure 28C:
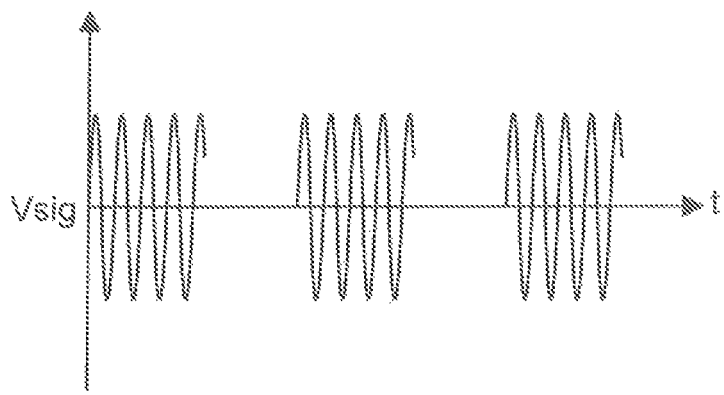

FIG. 28A to FIG. 28C are schematic views illustrating a sensor according to a fourth embodiment.

FIG. 28A is a block diagram. FIG. 28B and FIG. 28C illustrate the signal.

As shown in FIG. 28A, the sensor 110a according to the embodiment includes the drive power source 41D and a differential circuit unit 41C in addition to the first film 71, the sensors (the first sensor portion 51, the second sensor portion 52, the third sensor portion 53, etc.), the first element portion 41, and the controller 60. The portions other than the drive power source 41D and the differential circuit unit 41C are similar to the sensor 110; and a description is therefore omitted.

The drive power source 41D is connected to the first element portion 41. For example, a signal is supplied to the first element portion 41 from the drive power source 41D.

FIG. 28B and FIG. 28C illustrate the signal output from the drive power source 41D. In these figures, the horizontal axis is time t. The vertical axis is the strength of a signal Vsig. As shown in FIG. 28B, an alternating voltage is output as the signal Vsig from the drive power source 41D. For example, the frequency of the signal Vsig corresponds to an ultrasonic wave. The signal Vsig is, for example, an alternating voltage having the first voltage V1 as the center. Such a signal Vsig is applied to the first element portion 41. As shown in FIG. 28C, the alternating voltage may be output in a pulse form.

The first element portion 41 causes the first film 71 to oscillate based on the signal Vsig. Thereby, the electrical resistance Rs of the first sensor portion 51 oscillates. The frequency of the alternating current at which the amplitude of the electrical resistance Rs is the widest is the resonant frequency. For example, the oscillation is caused at the resonant frequency. Thereby, for example, an ultrasonic wave is generated. The ultrasonic wave that is generated is reflected by an object; and the reflected wave reaches the first film 71. At the first film 71, an oscillation is generated by the reflected wave in addition to the oscillation based on the signal Vsig. The electrical resistance Rs of the sensor portion (e.g., the first sensor portion 51) changes based on the two oscillations. The object can be sensed based on the difference between the two oscillations.

For example, the output (the signal Vsig) from the drive power source 41D and the output from the first sensor portion 51 are input to the differential circuit unit 41C. The differential circuit unit 41C outputs, as the output So, a signal corresponding to the difference between these input6s.

For example, the sensor 110A can be used as an "ultrasonic sensor." For example, the first element portion 41 causes the first film 71 to oscillate. For example, the first element portion 41 may function as an ultrasonic wave generator. For example, the first sensor portion 51 functions as an ultrasonic wave receiver. A highly-sensitive ultrasonic sensor can be provided.

In the sensor 110A, a direct current voltage may be output from the drive power source 41D; and the direct current voltage may be applied to the first element portion 41. By the direct current voltage, the stress Pc may be applied to the first film 71 from the first element portion 41. The direct current voltage is a bias voltage.

Figure 29:
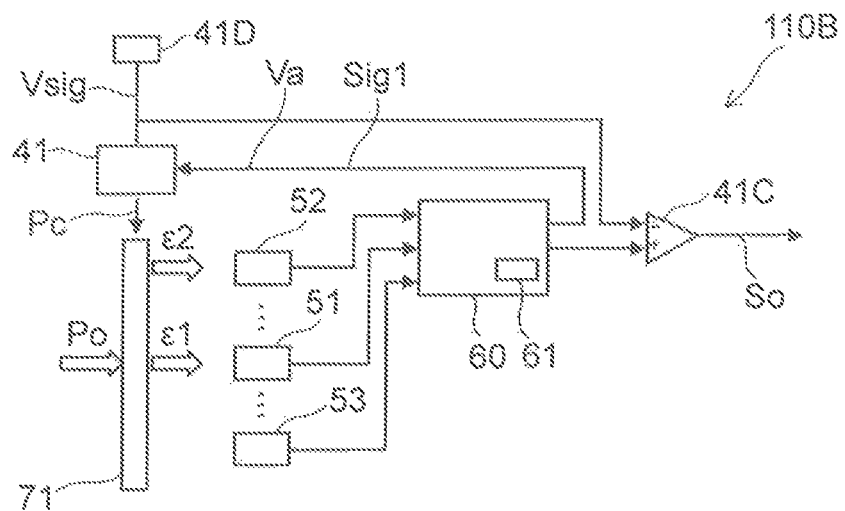
FIG. 29 is a schematic view illustrating a sensor according to the fourth embodiment.

FIG. 29 is a schematic view illustrating a sensor according to the fourth embodiment.

As shown in FIG. 29, the drive power source 41D and the differential circuit unit 41C are provided in the sensor 110B as well. Otherwise, for example, the configuration described in reference to FIG. 4A is applied.

Figure 30:
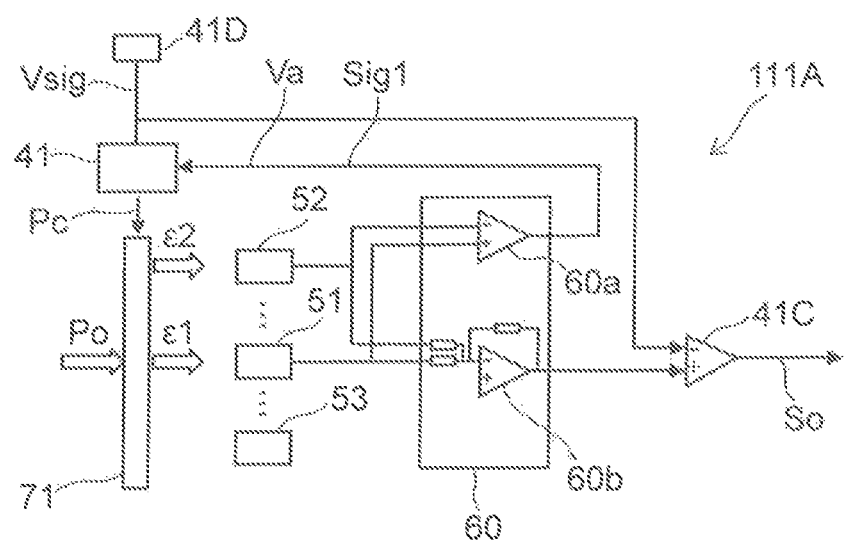
FIG. 30 is a schematic view illustrating a sensor according to the fourth embodiment.

FIG. 30 is a schematic view illustrating a sensor according to the fourth embodiment.

As shown in FIG. 30, the drive power source 41D and the differential circuit unit 41C are provided in the sensor 111a as well. Otherwise, for example, the configuration of the sensor 111a described in reference to FIG. 8 is applied.

Figure 31:
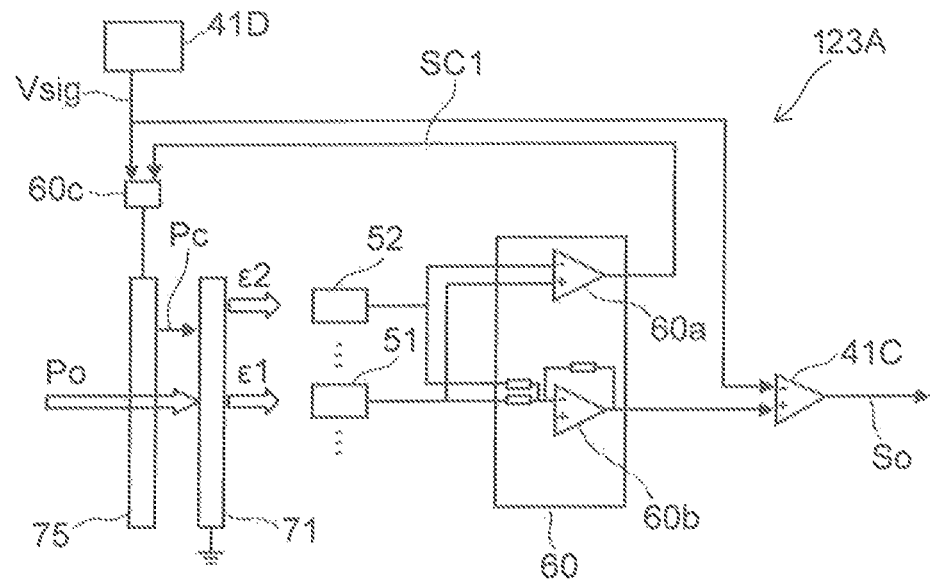
FIG. 31 is a schematic view illustrating a sensor according to the fourth embodiment.

FIG. 31 is a schematic view illustrating a sensor according to the fourth embodiment.

As shown in FIG. 31, the drive power source 41D and the differential circuit unit 41C are provided in the sensor 123A as well. Otherwise, for example, the configuration of the sensor 123 described in reference to FIG. 15 is applied.

In the sensors 110B, 111A, and 123A as well, for example, the alternating voltage having the first voltage V1 as the center is applied to the first element portion 41 by the drive power source 41D. Accordingly, the first film 71 oscillates; and the electrical resistance Rs of the first sensor portion 51 oscillates. The frequency of the alternating current at which the amplitude of the electrical resistance Rs is the widest is the resonant frequency. For example, the sensor can be used as an "ultrasonic sensor" by causing oscillations at the resonant frequency. For example, the first element portion 41 functions as an ultrasonic wave generator causing the first film 71 to oscillate. For example, the first sensor portion 51 senses the reflected wave of the ultrasonic wave generated by the oscillation of the first film 71. The first sensor portion 51 is used as an ultrasonic wave receiver. A highly-sensitive ultrasonic sensor can be provided.

The drive power source 41D and the differential circuit unit 41C also may be provided in the sensors 110a to 110c, 111, 112a to 112f, 113, 114, 120, 120a, 121, 121a, 122, etc.

Fifth Embodiment

The embodiment relates to an electronic device. The electronic device includes, for example, a sensor according to the embodiments recited above or a sensor of a modification of the embodiments. The electronic device includes, for example, an information terminal. The information terminal includes a recorder, etc. The electronic device includes a microphone, a blood pressure sensor, a touch panel, etc.

Figure 32:
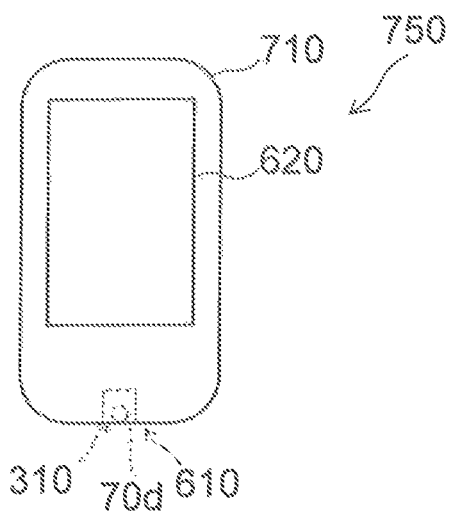
FIG. 32 is a schematic view illustrating an electronic device according to a fifth embodiment.

FIG. 32 is a schematic view illustrating the electronic device according to the fifth embodiment.

As shown in FIG. 32, an electronic device 750 according to the embodiment is, for example, an information terminal 710. For example, a microphone 610 is provided in the information terminal 710.

The microphone 610 includes, for example, a sensor 310. For example, the first film 71 is substantially parallel to the surface of the information terminal 710 where a display unit 620 is provided. The arrangement of the first film 71 is arbitrary. Any sensor described in reference to the first embodiment, the second embodiment, and the fourth embodiment is applicable to the sensor 310.

Figure 33A:
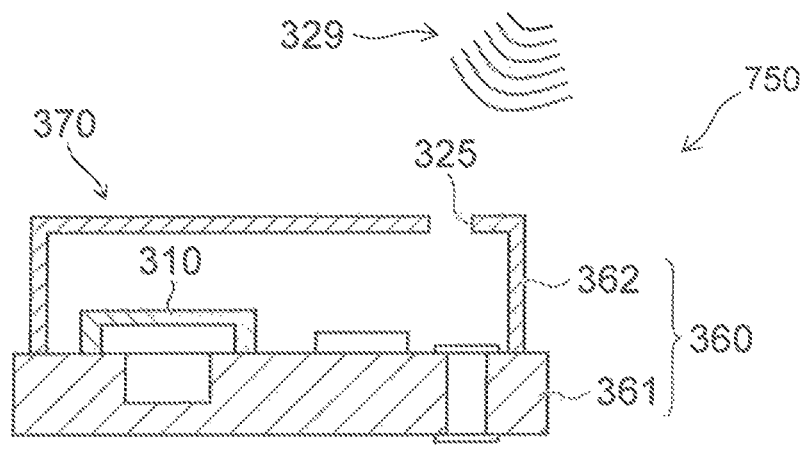
FIG. 33A and FIG. 33B are schematic cross-sectional views illustrating the electronic device according to the fifth embodiment.
Figure 33B:
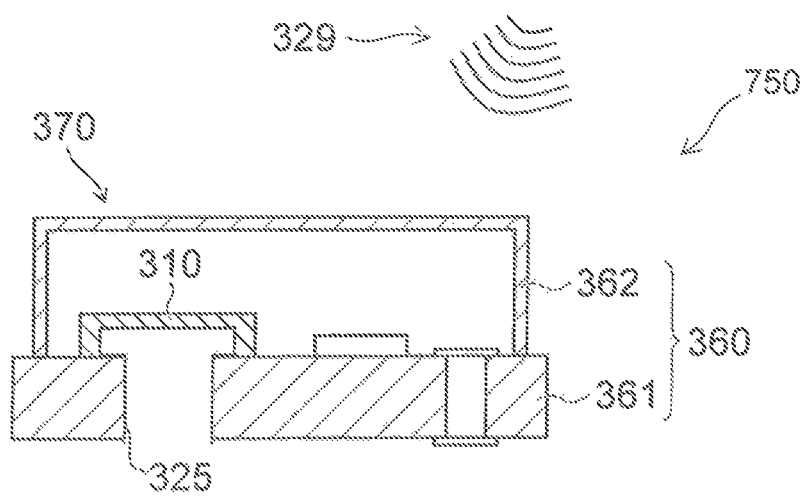

FIG. 33A and FIG. 33B are schematic cross-sectional views illustrating the electronic device according to the fifth embodiment.

As shown in FIG. 33A and FIG. 33B, the electronic device 750 (e.g., a microphone 370 (an acoustic microphone)) includes a housing 360, a cover 362, and the sensor 310. The housing 360 includes, for example, a substrate 361 (e.g., a printed circuit board) and a cover 362. The substrate 361 includes, for example, a circuit such as an amplifier, etc.

An acoustic hole 325 is provided in the housing 360 (at least one of the substrate 361 or the cover 362). In the example shown in FIG. 33B, the acoustic hole 325 is provided in the cover 362. In the example shown in FIG. 33B, the acoustic hole 325 is provided in the substrate 361. Sound 329 passes through the acoustic hole 325 and enters the interior of the cover 362. The microphone 370 responds to the sound pressure.

For example, the sensor 310 is placed on the substrate 361; and electrical signal lines (not illustrated) are provided. The cover 362 is provided to cover the sensor 310. The housing 360 is provided around the sensor 310. At least a portion of the sensor 310 is provided inside the housing 360. For example, the first sensor portion 51 and the first film 71 are provided between the substrate 361 and the cover 362. For example, the sensor 310 is provided between the substrate 361 and the cover 362.

FIG. 34A and FIG. 34B are schematic views illustrating another electronic device according to the fifth embodiment.

In the example of these drawings, the electronic device 750 is a blood pressure sensor 330. FIG. 34A is a schematic plan view illustrating skin on an arterial vessel of a human. FIG. 34B is a line H1-H2 cross-sectional view of FIG. 34A.

The sensor 310 is used as a sensor in the blood pressure sensor 330. The sensor 310 contacts skin 333 on an arterial vessel 331. Thereby, the blood pressure sensor 330 can continuously perform blood pressure measurements.

FIG. 35 is a schematic view illustrating another electronic device according to the fifth embodiment.

In the example of the drawing, the electronic device 750 is a touch panel 340. In the touch panel 340, the sensors 310 are provided in at least one of the interior of the display or the exterior of the display.

For example, the touch panel 340 includes multiple first interconnects 346, multiple second interconnects 347, the multiple sensors 310, and a control circuit 341.

In the example, the multiple first interconnects 346 are arranged along the Y-axis direction. Each of the multiple first interconnects 346 extends along the X-axis direction. The multiple second interconnects 347 are arranged along the X-axis direction. Each of the multiple second interconnects 347 extends along the Y-axis direction.

The multiple sensors 310 are provided respectively at the crossing portions between the multiple first interconnects 346 and the multiple second interconnects 347. One sensor 310 is used as one sensing component Es for sensing. The crossing portion includes the position where the first interconnect 346 and the second interconnect 347 cross and includes the region at the periphery of the position.

One end E1 of each of the multiple sensors 310 is connected to one of the multiple first interconnects 346. One other end E2 of each of the multiple sensors 310 is connected to one of the multiple second interconnects 347.

The control circuit 341 is connected to the multiple first interconnects 346 and the multiple second interconnects 347. For example, the control circuit 341 includes, a first interconnect circuit 346d that is connected to the multiple first interconnects 346, a second interconnect circuit 347d that is connected to the multiple second interconnects 347, and a control signal circuit 345 that is connected to the first interconnect circuit 346d and the second interconnect circuit 347d.

According to the fifth embodiment, an electronic device that uses a sensor in which the sensitivity can be increased can be provided.

The embodiments, for example, include the following configurations.

(Configuration 1)

A sensor, comprising:
a first film, the first film being deformable;
a first sensor portion provided at the first film, the first sensor portion including
a first magnetic layer,
a second magnetic layer provided between the first film and the first magnetic layer, and
a first intermediate layer provided between the first magnetic layer and the second magnetic layer; and
a first element portion including a first piezoelectric layer fixed to the first film.

(Configuration 2)

The sensor according to configuration 1, wherein
the first element portion has a first state and a second state, a first signal being input in the first state, the second state being different from the first state, and a shape of the first film in the first state is different from a shape of the first film in the second state.

(Configuration 3)

The sensor according to configuration 2, further comprising a controller being electrically connected to the first element portion and configured to supply the first signal to the first element portion.

(Configuration 4)

The sensor according to configuration 4, wherein the controller sets the first signal according to an electrical resistance between the first magnetic layer and the second magnetic layer.

(Configuration 5)

The sensor according to one of configurations 1 to 4, wherein the first element portion is provided at the first film.

(Configuration 6)

The sensor according to one of configurations 1 to 5, wherein the first piezoelectric layer overlaps the first film in a first direction connecting the first film and the first sensor portion.

(Configuration 7)

The sensor according to configuration 6, wherein at least a portion of the first magnetic layer is provided between the first film and at least a portion of the first piezoelectric layer in the first direction.

(Configuration 8)

The sensor according to configuration 6, wherein at least a portion of the first piezoelectric layer is provided between the first film and at least a portion of the first magnetic layer in the first direction.

(Configuration 9)

The sensor according to configuration 6, wherein at least a portion of the first film is provided between at least a portion of the first magnetic layer and at least a portion of the first piezoelectric layer in the first direction.

(Configuration 10)

The sensor according to one of configurations 6 to 9, further comprising:
a second sensor portion provided at the first film, the second sensor portion including
a third magnetic layer,
a fourth magnetic layer provided between the first film and the third magnetic layer, and
a second intermediate layer provided between the third magnetic layer and the fourth magnetic layer; and
a second element portion including a second piezoelectric layer overlapping the first film in the first direction,
the second sensor portion being separated from the first sensor portion in a second direction crossing the first direction,
the first element portion being arranged with at least a portion of the first sensor portion in a third direction crossing the first direction and the second direction,
the second element portion being arranged with at least a portion of the second sensor portion in the third direction.

(Configuration 11)

The sensor according to one of configurations 6 to 9, further comprising:
a second film, the second film being deformable;
a second sensor portion provided at the second film, the second sensor portion including
a third magnetic layer,
a fourth magnetic layer provided between the second film and the third magnetic layer, and
a second intermediate layer provided between the third magnetic layer and the fourth magnetic layer; and
a second element portion including a second piezoelectric layer overlapping the second film in the first direction,
the second film being arranged with the first film in a direction crossing the first direction,
at least a portion of the first element portion being arranged with the first sensor portion in the direction crossing the first direction,
at least a portion of the second element portion being arranged with the second sensor portion in the direction crossing the first direction.

(Configuration 12)

A sensor, comprising:
a first film, the first film being deformable;
a first opposing film;
a first sensor portion provided at the first film, the first sensor portion including
a first magnetic layer,
a second magnetic layer provided between the first film and the first magnetic layer, and
a first intermediate layer provided between the first magnetic layer and the second magnetic layer;
a first film electrode connected to the first film; and
a first opposing film electrode connected to the first opposing film,
the first opposing film including a portion separated from the first film in a first direction, the first direction connecting the first film and the first sensor portion (Configuration 13)

The sensor according to configuration 12, wherein
the first film has a first state and a second state, a first control signal being applied between the first film electrode and the first opposing film electrode in the first state, the second state being different from the first state, and
a shape of the first film in the first state is different from a shape of the first film in the second state.

(Configuration 14)

The sensor according to configuration 13, further comprising a controller being electrically connected to the first film electrode and the first opposing film electrode and configured to supply the first control signal between the first film electrode and the first opposing film electrode.

(Configuration 15)

The sensor according to configuration 14, wherein the controller controls the first control signal according to an electrical resistance between the first magnetic layer and the second magnetic layer.

(Configuration 16)

The sensor according to one of configurations 12 to 15, wherein
the first opposing film has at least one of
a thickness thicker than a thickness of the first film, or
an elastic modulus higher than an elastic modulus of the first film.

(Configuration 17)

The sensor according to one of configurations 12 to 16, wherein
the first opposing film includes:
a first material portion; and
a second material portion overlapping the first material portion in the first direction and including a material different from the first material portion.

(Configuration 18)

The sensor according to one of configurations 12 to 17, wherein the first opposing film has a hole piercing the first opposing film in the first direction.

(Configuration 19)
The sensor according to one of configurations 12 to 18, further comprising:
a second film, the second film being deformable; and
a second sensor portion provided at the second film, the second sensor portion including
a third magnetic layer,
a fourth magnetic layer provided between the second film and the third magnetic layer, and
a second intermediate layer provided between the third magnetic layer and the fourth magnetic layer,
the first opposing film overlapping the second film in the first direction.

(Configuration 20)
The sensor according to configuration 1, further comprising:
a substrate; and
a cover,
the first sensor portion and the first film being provided between the substrate and the cover.

(Configuration 21)
An electronic device, comprising:
the sensor according to one of configurations 1 to 20; and
a housing.

(Configuration 22)
A sensor, comprising:
a first film, the first film being deformable;
a first sensor portion provided at the first film, the first sensor portion including
a first magnetic layer,
a second magnetic layer provided between the first film and the first magnetic layer, and
a first intermediate layer provided between the first magnetic layer and the second magnetic layer;
a first element portion including a first piezoelectric layer fixed to the first film; and
a controller being electrically connected to the first element portion and configured to supply a first signal to the first element portion,
the first element portion having a first state and a second state, the first signal being input in the first state, the second state being different from the first state,
a shape of the first film in the first state being different from a shape of the first film in the second state,
an electrical resistance of the first sensor portion having a maximum value and a minimum value when a voltage supplied to the first element portion being changed, and
the controller being configured to control the first signal so that an electrical resistance of the first sensor portion when the first signal is supplied to the first element portion becomes an average of the maximum value and the minimum value.

(Configuration 23)
A sensor; comprising:
a first film, the first film being deformable;
a first opposing film;
a first sensor portion provided at the first film, the first sensor portion including
a first magnetic layer,
a second magnetic layer provided between the first film and the first magnetic layer, and
a first intermediate layer provided between the first magnetic layer and the second magnetic layer;
a first film electrode connected to the first film;
a first opposing film electrode connected to the first opposing film; and
a controller being electrically connected to the first film electrode and the first opposing film electrode, the controller being configured to supply a first control signal between the first film electrode and the first opposing film electrode,
the first opposing film including a portion separated from the first film in a first direction, the first direction connecting the first film and the first sensor portion
the first film having a first state and a second state, the first control signal being applied between the first film electrode and the first opposing film electrode in the first state, the second state being different from the first state,
a shape of the first film in the first state is different from a shape of the first film in the second state,
an electrical resistance of the first sensor portion having a maximum value and a minimum value when a voltage supplied between the first film electrode and the first opposing film electrode, and
the controller being configured to control the first control signal so that an electrical resistance of the first sensor portion when the first control signal is supplied between the first film electrode and the first opposing film electrode becomes an average of the maximum value and the minimum value.

(Configuration 24)
An electronic device, comprising:
the sensor according to one of configurations 22 or 23; and
a housing. The "sensor" may be a "sensor device", for example. A configuration including the "sensor device" and the controller can be regarded as "sensor". The "sensor" may include at least one of substrate and cover.

According to the embodiments, a sensor and an electronic device in which the sensing precision can be increased are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as sensor portions, magnetic layers, conductive layers, electrodes, films, support portions, element portions, opposing films, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and electronic devices practicable by an appropriate design modification by one skilled in the art based on the sensors and the electronic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
   a first film, the first film being deformable;
   a first sensor portion provided at the first film, the first sensor portion including
      a first magnetic layer,
      a second magnetic layer provided between the first film and the first magnetic layer, and
      a first intermediate layer provided between the first magnetic layer and the second magnetic layer; and
   a first element portion including a first piezoelectric layer fixed to the first film.

2. The sensor according to claim 1, wherein
   the first element portion has a first state and a second state, a first signal being input in the first state, the second state being different from the first state, and
   a shape of the first film in the first state is different from a shape of the first film in the second state.

3. The sensor according to claim 2, further comprising a controller being electrically connected to the first element portion and configured to supply the first signal to the first element portion.

4. The sensor according to claim 3, wherein the controller sets the first signal according to an electrical resistance between the first magnetic layer and the second magnetic layer.

5. The sensor according to claim 1, wherein the first element portion is provided at the first film.

6. The sensor according to claim 1, wherein the first piezoelectric layer overlaps the first film in a first direction connecting the first film and the first sensor portion.

7. The sensor according to claim 6, wherein at least a portion of the first magnetic layer is provided between the first film and at least a portion of the first piezoelectric layer in the first direction.

8. The sensor according to claim 6, wherein at least a portion of the first piezoelectric layer is provided between the first film and at least a portion of the first magnetic layer in the first direction.

9. The sensor according to claim 6, wherein at least a portion of the first film is provided between at least a portion of the first magnetic layer and at least a portion of the first piezoelectric layer in the first direction.

10. The sensor according to claim 6, further comprising:
    a second sensor portion provided at the first film, the second sensor portion including
       a third magnetic layer,
       a fourth magnetic layer provided between the first film and the third magnetic layer, and
       a second intermediate layer provided between the third magnetic layer and the fourth magnetic layer; and
    a second element portion including a second piezoelectric layer overlapping the first film in the first direction,
    the second sensor portion being separated from the first sensor portion in a second direction crossing the first direction,
    the first element portion being arranged with at least a portion of the first sensor portion in a third direction crossing the first direction and the second direction,
    the second element portion being arranged with at least a portion of the second sensor portion in the third direction.

11. The sensor according to claim 6, further comprising:
    a second film, the second film being deformable;
    a second sensor portion provided at the second film, the second sensor portion including
       a third magnetic layer,
       a fourth magnetic layer provided between the second film and the third magnetic layer, and
       a second intermediate layer provided between the third magnetic layer and the fourth magnetic layer; and
    a second element portion including a second piezoelectric layer overlapping the second film in the first direction,
    the second film being arranged with the first film in a direction crossing the first direction,
    at least a portion of the first element portion being arranged with the first sensor portion in the direction crossing the first direction,
    at least a portion of the second element portion being arranged with the second sensor portion in the direction crossing the first direction.

12. A sensor comprising:
    a first film, the first film being deformable;
    a first opposing film;
    a first sensor portion provided at the first film, the first sensor portion including
       a first magnetic layer,
       a second magnetic layer provided between the first film and the first magnetic layer, and
       a first intermediate layer provided between the first magnetic layer and the second magnetic layer;
    a first film electrode connected to the first film; and
    a first opposing film electrode connected to the first opposing film,
    the first opposing film including a portion separated from the first film in a first direction, the first direction connecting the first film and the first sensor portion.

13. The sensor according to claim 12, wherein
    the first film has a first state and a second state, a first control signal being applied between the first film electrode and the first opposing film electrode in the first state, the second state being different from the first state, and
    a shape of the first film in the first state is different from a shape of the first film in the second state.

14. The sensor according to claim 13, further comprising a controller being electrically connected to the first film electrode and the first opposing film electrode and configured to supply the first control signal between the first film electrode and the first opposing film electrode.

15. The sensor according to claim 14, wherein the controller controls the first control signal according to an electrical resistance between the first magnetic layer and the second magnetic layer.

16. The sensor according to claim 12, wherein
    the first opposing film has at least one of
       a thickness thicker than a thickness of the first film, or
       an elastic modulus higher than an elastic modulus of the first film.

17. The sensor according to claim 12, wherein
the first opposing film includes:
- a first material portion; and
- a second material portion overlapping the first material portion in the first direction and including a material different from the first material portion.

18. The sensor according to claim 12, wherein the first opposing film has a hole piercing the first opposing film in the first direction.

19. The sensor according to claim 12, further comprising:
- a second film, the second film being deformable; and
- a second sensor portion provided at the second film, the second sensor portion including
  - a third magnetic layer,
  - a fourth magnetic layer provided between the second film and the third magnetic layer, and
  - a second intermediate layer provided between the third magnetic layer and the fourth magnetic layer, the first opposing film overlapping the second film in the first direction.

20. An electronic device, comprising:
- a sensor; and
- a housing, the sensor including:
- a first film, the first film being deformable;
- a first sensor portion provided at the first film, the first sensor portion including
  - a first magnetic layer,
  - a second magnetic layer provided between the first film and the first magnetic layer; and
  - a first intermediate layer provided between the first magnetic layer and the second magnetic layer; and
- a first element portion including a first piezoelectric layer fixed to the first film.

* * * * *